US012326775B2

(12) United States Patent
Bettine et al.

(10) Patent No.: US 12,326,775 B2
(45) Date of Patent: Jun. 10, 2025

(54) SELF-ISOLATION OF POWER-MANAGEMENT INTEGRATED CIRCUITS OF MEMORY MODULES UNDER FAULT CONDITIONS

(71) Applicant: Intel Corporation, Santa Clara, CA (US)

(72) Inventors: Norma Bettine, Chandler, AZ (US); Pavan Kumar, Portland, OR (US); Justin Tippetts, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 570 days.

(21) Appl. No.: 17/538,052

(22) Filed: Nov. 30, 2021

(65) Prior Publication Data

US 2023/0168959 A1 Jun. 1, 2023

(51) Int. Cl.
*G06F 11/00* (2006.01)
*G06F 11/07* (2006.01)
(Continued)

(52) U.S. Cl.
CPC ...... *G06F 11/0754* (2013.01); *G06F 11/0706* (2013.01); *G06F 11/0772* (2013.01); *G11C 5/148* (2013.01); *G06F 9/4401* (2013.01)

(58) Field of Classification Search
CPC ............. G06F 11/0754; G06F 11/0706; G06F 11/0772; G06F 11/073; G06F 11/0793
See application file for complete search history.

(56) References Cited

U.S. PATENT DOCUMENTS 8,612,779 B2 * 12/2013 More ............... G06F 1/3203 713/320
9,778,988 B2 * 10/2017 Huang ............... G06F 1/30
(Continued)

FOREIGN PATENT DOCUMENTS

| CN | 117616503 A | 2/2024 |
| WO | 2023101791 | 6/2023 |

OTHER PUBLICATIONS

"International Application Serial No. PCT US2022 048830, International Preliminary Report on Patentability mailed Jun. 13, 2024", 7 pgs.
(Continued)

*Primary Examiner* — Amine Riad
(74) *Attorney, Agent, or Firm* — Schwegman Lundberg & Woessner, P.A.

(57) ABSTRACT

Disclosed herein are systems and methods for self-isolation of power-management integrated circuits (PMICs) of memory modules under and in response to fault conditions. In an embodiment, a PMIC is operably engaged with a memory module that is operably engaged with a platform. The memory module includes a non-volatile-memory block having a power supply controlled by the PMIC. The PMIC has a critical-fault signal pin that can be asserted to shut down the platform. The PMIC determines whether at least one critical fault occurred during a prior cycle, and also determines whether a critical fault occurs during a bootup sequence during a current cycle. Based on determining that a prior-cycle critical fault occurred and that a critical fault occurs during the bootup sequence, the PMIC sets a critical-fault indicator corresponding to the current critical fault; powers down the power supply; and does not assert the critical-fault signal pin.

21 Claims, 7 Drawing Sheets

(51) Int. Cl.
 *G11C 5/14* (2006.01)
 *G06F 9/4401* (2018.01)

(56) References Cited

U.S. PATENT DOCUMENTS

| | | | |
|---|---|---|---|
| 10,916,326 | B1 | 2/2021 | Holmberg, Jr. et al. |
| 10,936,049 | B2* | 3/2021 | Mocanu ............... G06F 3/0604 |
| 11,334,512 | B1* | 5/2022 | Tripathy ................ G06F 21/81 |
| 11,348,620 | B1* | 5/2022 | Lambert ............. G06F 11/3037 |
| 12,105,661 | B2* | 10/2024 | Seok ..................... G06F 9/4405 |
| 2016/0062819 | A1 | 3/2016 | Oh et al. |
| 2018/0348833 | A1 | 12/2018 | Beeston et al. |
| 2021/0133022 | A1 | 5/2021 | Chao et al. |
| 2021/0209003 | A1 | 7/2021 | Kowkutla et al. |

OTHER PUBLICATIONS

"International Application Serial No. PCT US2022 048830, International Search Report mailed Mar. 13, 2023", 3 pgs.
"International Application Serial No. PCT US2022 048830, Written Opinion mailed Mar. 13, 2023", 5 pgs.

* cited by examiner

| Critical Fault[7] | FAULT_CODE_0 to 7 | | | | | | | Fault Description |
|---|---|---|---|---|---|---|---|---|
| | FAULT_CODE[6:0] | | | | | | | |
| 1 | 0 | 0 | 0 | 0 | 0 | 0 | 1 | Critical – Output VR/Rail A, UVP Fault |
| 0 | 0 | 1 | 0 | 0 | 1 | 1 | 0 | Non-Critical – Input Vin12V OVP Fault |
| 1 | 0 | 0 | 1 | 0 | 0 | 0 | 0 | Critical – Output VR/Rail H OVP Fault |
| 0 | 0 | 0 | 0 | 0 | 0 | 0 | 0 | |
| 0 | 0 | 0 | 0 | 0 | 0 | 0 | 0 | |
| 0 | 0 | 0 | 0 | 0 | 0 | 0 | 0 | |
| 0 | 0 | 0 | 0 | 0 | 0 | 0 | 0 | |

FIG. 3

SELF-ISOLATION OF POWER-MANAGEMENT INTEGRATED CIRCUITS OF MEMORY MODULES UNDER FAULT CONDITIONS

TECHNICAL FIELD

Embodiments of the present disclosure relate to memory modules, integrated circuits (ICs), power management and fault management in multiple-memory-module systems and, more particularly, to systems and methods for self-isolation of power-management ICs (PMICs) of memory modules under and in response to fault conditions.

BACKGROUND

Many computer systems (e.g., platforms, hosts, servers, and the like) include one or more memory modules known as dual in-line memory modules (DIMMs). It can occur that a critical fault that occurs on one of the DIMMs in such a system results in a shutdown of the entire system, necessitating a full hardware reboot to get the system back up and running. In some instances, critical faults prevent the system from booting up successfully. It is important in the context of most computer systems that they are able to reliably detect and recover from critical faults.

BRIEF DESCRIPTION OF THE DRAWINGS

A more detailed understanding may be had from the following description, which is presented by way of example in conjunction with the following drawings, in which like reference numerals are used across the drawings in connection with like elements.

FIG. 3 depicts an example fault-code-register history that may be maintained by the example PMIC of the example persistent-storage DIMM of FIG. 1, in accordance with at least one embodiment.

DETAILED DESCRIPTION

Figure 1:
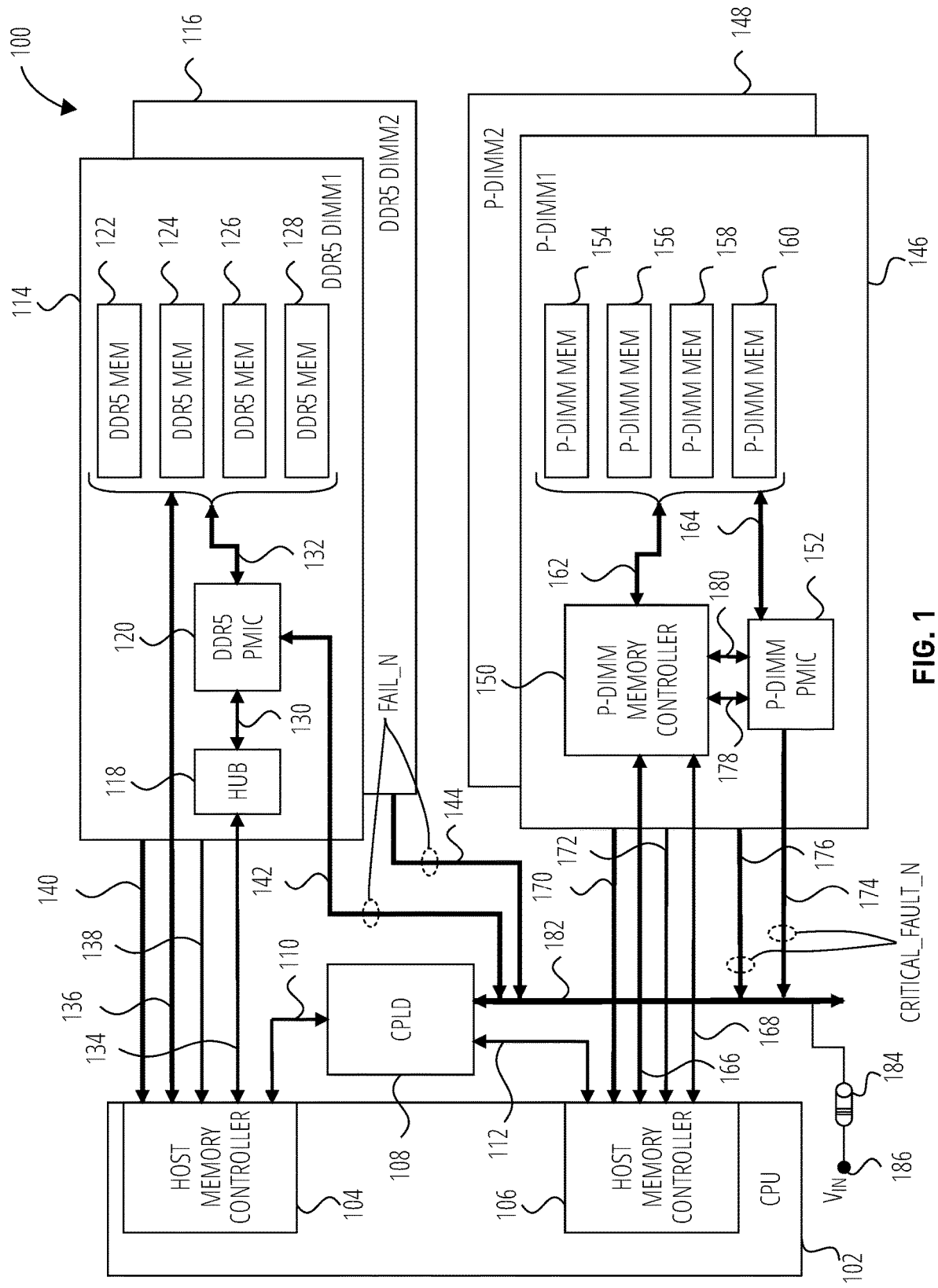
FIG. 1 depicts an example platform architecture that includes an example persistent-storage DIMM that itself includes an example PMIC, in accordance with at least one embodiment.

In many older implementations of servers and other computer systems, DIMMs are powered by components known as voltage regulators (VRs) that are situated on the platform (e.g., on the motherboard) in which the DIMM is operating. In the present disclosure, "platform" is used as a broad, generic term to encompass computer systems, hosts, devices, and/or the like in which a given DIMM is operating. In an example older implementation that uses DDR4-based DIMMs, any fault on the power system of the platform is readily detectable by all of the DIMMs on the platform. Unlike DDR4-based DIMMs, however, DDR5-based DIMMs are powered by individual ICs that are integral to each respective DDR5-based DIMM. These individual ICs are referred to as PMICs. The use of DIMMs that have PMICs (hereinafter "PMIC DIMMs") has certain benefits, one of which is that PMIC DIMMs are more secure than earlier generations of DIMMs that do not have PMICs ("non-PMIC DIMMs"). The use of PMIC DIMMs also presents some challenges, one of which is that a critical fault on a PMIC DIMM is not readily detectable by other DIMMs in the system.

To address this, a separate shared interface (including signal pins such as PWRFAIL, CRITICAL_FAULT_N, and CAMP, among others) has been defined in the context of DDR5-based DIMMs for communication, from fault-impacted DIMMs to the platform, of fault-related information. This separate shared interface is referred to in this disclosure as the "shared fault-reporting interface." In connection with the shared fault-reporting interface, the Register Transfer Level (RTL) logic of the PMIC (referred to herein as "the PMIC RTL logic") of the impacted DIMM is typically designed to drive a shared signal pin (CRITICAL_FAULT_N) low to communicate that a critical fault has occurred. This in turn inhibits the platform from powering up (or causes the platform to shut down if the critical fault occurs after the platform has already been powered on). Under a critical-fault condition, the Basic Input-Output System (BIOS) of the platform will typically intervene to poll each DIMM and isolate the faulty DIMM before rebooting the platform.

This approach, however, is not workable in connection with a certain type of DDR5-compatible DIMM that is configured to provide persistent memory (i.e., non-volatile memory (NVM)) to the platform. Such DIMMs are referred to in the present disclosure as "persistent-memory DIMMs" or "persistent DIMMs" (and as "P-DIMMs" for short). In embodiments of the present disclosure, P-DIMMs present a DDR5-compatible interface to the platform. One of the reasons that the above-described shared fault-reporting interface is not successfully applicable to P-DIMMs is that, unlike DDR5 implementations, the PMIC on each P-DIMM (referred to herein as the "P-DIMM PMIC") is not directly accessible to the platform. Rather, as described more fully below, the architecture of P-DIMMs places the P-DIMM PMIC (and the individual memory components of the P-DIMM) behind a memory controller that is resident on the P-DIMM (and that is referred to herein as a "P-DIMM memory controller"). One main reason for the placement of the P-DIMM PMIC behind the P-DIMM memory controller is to provide enhanced security. Indeed, direct access to a P-DIMM PMIC by a platform would be a security risk that could be exploited by hackers and other nefarious actors.

Another complication in the context of critical faults (and especially repeating critical faults) occurring on P-DIMMs is that, unlike the PMICs in standard DDR5 implementations (referred to herein as "DDR5 PMICs"), PMICs are designed such that they do not wait for a command before turning on the power rails to the memory components resident on the P-DIMM. That is, P-DIMM PMICs do not wait for any other entity to instruct them to activate the power rails to their memory components. Instead, when installed in a socket, the PMICs of those P-DIMMs activate the P-DIMM's power rails as soon as their received input voltage rises to a certain threshold (e.g., 12V).

Thus, even in the case of a repeating (i.e., persistent) critical fault, a P-DIMM PMIC begins, as it does in its normal course of operation, activating the power rails on the P-DIMM as soon as the input voltage to the P-DIMM PMIC rises to the corresponding threshold level. The repeating critical fault recurs, and therefore keeps either bringing down the system or preventing it from successfully booting up. The reason for this is that hosts and other platforms are typically configured to shut down (or not boot up) if there is even a single critical-fault signal from a DIMM. Some architectural differences between DDR5 DIMMs and P-DIMMs, as well as some consequences of such differences, are discussed below in connection with FIG. 1 and the other figures.

In connection with at least one embodiment of the present disclosure, a P-DIMM—that is experiencing the type of repeating critical fault that is discussed above—not only isolates itself, but does so in a way that enables the host or other platform to successfully boot up. Among other configurations, some embodiments of the present disclosure are applicable to DIMMs (e.g., P-DIMMs) that have the following two characteristics:

1. the DIMMs are configured to power up automatically and autonomously, as described above, in response to their input voltage reaching a predefined threshold; and
2. the DIMMs do not provide the platform with direct access to either the PMIC on the DIMM or to the memory components on the DIMM.

Moreover, some embodiments of the present disclosure are applicable to DIMMs (e.g., P-DIMMs) that have one but not both of those characteristics. Additionally, some embodiments of the present disclosure are applicable to DIMMs (e.g., P-DIMMs) that have neither of those characteristics. And certainly there is overlap—i.e., numerous embodiments are applicable to all three: i.e., to DIMMs (e.g., P-DIMMs) that have neither of these characteristics, to DIMMs (e.g., P-DIMMs) that have one but not both of these characteristics, and to DIMMs (e.g., P-DIMMs) that have both of these characteristics.

In at least one embodiment, the term "critical faults" includes faults that involve an electrical malfunction that places the corresponding platform in an error state (e.g., an undefined state, an unstable state, a corrupted state, and/or the like), such that a successful reboot operation of the platform is needed in order for the platform to resume normal operations. Some examples of critical faults that are discussed in this disclosure include output-rail faults such as overvoltage-protection (OVP) faults, undervoltage-protection (UVP) faults, and overcurrent-protection (OCP) faults. Another example of a type of "critical fault" in accordance with at least one embodiment are PMIC critical-temperature faults. And certainly numerous other types of faults could be listed here instead of or in addition to one or more of the example critical faults that are mentioned in this paragraph and/or elsewhere in the present disclosure.

Moreover, generally speaking, when implementing various different embodiments of the present disclosure, those of skill in the art have the flexibility to designate one or more faults of their choosing as being "critical faults" in the context of their particular implementation (and/or to designate categories having other labels, and so forth). Thus, there is no one definition of what makes a given fault a critical fault or not a critical fault; in many implementations, however, the types of faults that necessitate shutdown and successful reboot of the system are designated as being critical faults. In some implementations, critical faults include those faults that, if not dealt with in some manner, could (e.g., are likely to) cause damage to power-delivery circuits and/or downstream devices, which is why an immediate shutdown is typically indicated in connection with such faults.

Further examples of embodiments of the present disclosure are discussed below in connection with the various figures.

FIG. 1 depicts an example platform architecture 100 of an example platform, and is intended to be viewed and understood as being broadly applicable to numerous different types of platforms, hosts, systems, servers, and/or the like in which P-DIMMs may be implemented. As can be seen in FIG. 1, the platform architecture 100 includes a CPU 102, a complex programmable logic device (CPLD) 108, and two sets of DIMMs, where each such set includes two DIMMs. This is all by way of example to illustrate embodiments of the present disclosure; other architectures could be used as well.

In the example arrangement of FIG. 1, the CPU 102 includes a host memory controller 104 and a host memory controller 106. The host memory controller 104 is in communication with the CPLD 108 via a data link 110, and the host memory controller 106 is in communication with the CPLD 108 via a data link 112. In some embodiments, the CPLD 108 is implemented using a field-programmable gate array (FPGA), though other implementations could certainly be utilized.

The platform architecture 100 also includes the aforementioned two groups of DIMMs. The first group is a group of two DDR5 DIMMs: a DDR5 DIMM1 114 and a DDR5 DIMM2 116. Any suitable number (e.g., 1, 4, 8, 32, etc.) of DDR5 DIMMs could be present in a given implementation (if DDR5 DIMMs are even present at all, which they need not be). The second group is a group of two P-DIMMs: a P-DIMM1 146 and a P-DIMM2 148. Similarly, any suitable number (e.g., 1, 8, 16, 32, 64, etc.) of P-DIMMs could be present in a given example implementation.

The DDR5 DIMM1 114 includes a hub 118, a DDR5 PMIC 120, and an example set of four DDR5 memory components: a DDR5 memory component 122, a DDR5 memory component 124, a DDR5 memory component 126, and a DDR5 memory component 128. The four DDR5 memory components 122-128 are provided by way of example, as any suitable number of DDR5 memory components could be present in various different implementations. The DDR5 PMIC 120 is connected to the DDR5 memory components 122-128 via DDR5 power rails 132. As known in the art, "power rails," "rails," and the like are terms that are commonly used to refer to the input-voltage source to a given memory component or set of memory components.

Additionally, the DDR5 PMIC 120 communicates with the hub 118 via an I2C/I3C bus 130, and the hub 118 in turn communicates with the host memory controller 104 via an I2C/I3C bus 134. The host memory controller 104 communicates via the I2C/I3C bus 134 with the hub 118, and also communicates with the DDR5 memory components 122-128 over a data bus 136. Furthermore, the host memory controller 104 communicates with parallel components (that are not explicitly depicted) of the DDR5 DIMM2 116 via an I2C/I3C bus 138 and a data bus 140. Furthermore, both the DDR5 DIMM1 114 and the DDR5 DIMM2 116 have a connection via which they can hold down the (bidirectional) FAIL_N signal pins 142 and 144, respectively. As is visible with respect to the DDR5 DIMM1 114, the FAIL_N signal pin 142 is transmitted from the DDR5 PMIC 120 to a data bus 182, which is communicatively connected to the CPLD 108. In various different implementations, any DDR5 DIMM on a given platform asserting (e.g., holding down) its respective FAIL_N signal pin causes the platform to shut down and need a reboot.

The DDR5 PMIC 120 on the DDR5 DIMM1 114 may power up in two stages. First, the DDR5 PMIC 120 may power on the minimum logic that establishes communication with the BIOS of the platform through the I2C and/or I3C bus. The second stage may involve the BIOS individually sending a command to the DDR5 PMIC 120, instructing the DDR5 PMIC 120 to power up the DDR5 memory components 122-128 using the DDR5 power rails 132. If a DDR5 DIMM with a PMIC fault has been populated in the system, the BIOS will check the PMIC's fault registers to determine whether a previous fault had occurred, and may accordingly not instruct the corresponding DDR5 PMIC to power up its DDR5 power rails. This feature of a DDR5 DIMM not turning on its DDR5 power rails until instructed to do so by the platform is not a feature of the P-DIMMs of embodiments of the present disclosure, including the example P-DIMM1 146 and P-DIMM2 148. Rather, as described above, those P-DIMMs are designed such that, when the input voltage of the corresponding P-DIMM PMIC reaches the predefined threshold, the power rails are automatically powered up on the P-DIMM. This manner of powering on the rails, in addition to being labeled "automatic," could also be labeled "autonomous," as is more fully described below.

Turning now to the components of the P-DIMM1 146, it can be seen that the P-DIMM1 146 includes a P-DIMM memory controller 150, a P-DIMM PMIC 152, and a set of four P-DIMM memory components 154, 156, 158, and 160. The P-DIMM memory controller 150 is in communication with the P-DIMM memory components 154-160 via a data bus 162. The P-DIMM memory controller 150 is also in communication with the host memory controller 106 via a P-DIMM1 data bus 166 and an I2C/I3C bus 168. The host memory controller 106 is also in communication with parallel components (that are not explicitly depicted) of the P-DIMM2 148 via a P-DIMM2 data bus 170 and an I2C/I3C bus 172.

Returning to the P-DIMM1 146, the P-DIMM memory controller 150 is also in communication with the P-DIMM PMIC 152 via a data link 178 and an I2C bus 180. It is noted that, in at least one embodiment, there are no direct connections between the P-DIMM PMIC 152 and the host memory controller 106, which is in contrast to the direct connections that are present between the host memory controller 104 and the DDR5 PMIC 120: e.g., the sequence of the I2C/I3C bus 134, the hub 118, and the I2C/I3C bus 130, as well as the FAIL_N signal pin 142. It is noted that the I2C/I3C bus 134—hub 118—I2C/I3C bus 130 connection is considered direct in the parlance of this disclosure because the hub 118 is essentially a pass-through between the I2C/I3C bus 134 and the I2C/I3C bus 130.

Similarly, in at least one embodiment, there are no direct connections between the host memory controller 106 and the P-DIMM memory components 154-160, which is in contrast to the direct data-bus connection (i.e., the data bus 136) that is present between the host memory controller 104 and the DDR5 memory components 122-128. It can be seen that, from the perspective of entities outside of the P-DIMM1 146, both the P-DIMM PMIC 152 and the P-DIMM memory components 154-160 sit architecturally and communicatively "behind" the P-DIMM memory controller 150, as the term "behind" is used in the art. Also present in the P-DIMM1 146 are the P-DIMM power rails 164, which extend between the P-DIMM PMIC 152 and the P-DIMM memory components 154-160, and which are controlled by the P-DIMM PMIC 152. As can be seen in FIG. 1, the component (i.e., the DDR5 PMIC 120) that activates and deactivates the DDR5 power rails 132 in the DDR5 DIMM1 114 is directly accessible to the host memory controller 104, whereas the component (i.e., the P-DIMM PMIC 152) that activates and deactivates the P-DIMM power rails 164 in the P-DIMM1 146 is not directly accessible to the host memory controller 106. In the latter case, the P-DIMM memory controller 150 sits in between the host memory controller 106 and the P-DIMM PMIC 152, and is not a simple pass-through device like a hub, for example.

Moreover, analogous to the above-described FAIL_N signal pin 142 and FAIL_N signal pin 144 of the DDR5 DIMM1 114, it can be seen that the P-DIMM1 146 is connected to the data bus 182 by way of the P-DIMM PMIC 152 via a (unidirectional) CRITICAL_FAULT_N signal pin 174. Similarly, the P-DIMM2 148 is connected to the data bus 182 via a (unidirectional) CRITICAL_FAULT_N signal pin 176. The "FAIL_N" and "CRITICAL_FAULT_N" signal pins (which are sometimes referred to herein as "signals" rather than "signal pins") are further discussed below. Moreover, it can be seen that a pull-up resistor 184 is connected between an input voltage 186 and the data bus 182. In embodiments of the present disclosure, this arrangement functions to hold the collective FAIL_N/ CRITICAL_FAULT_N signal high unless it is affirmatively driven low by one or more DIMMs. Other architectures could be used as well.

As mentioned above, the P-DIMM PMIC 152 is not architecturally or communicatively arranged in the P-DIMM1 146 in the manner in which the DDR5 PMIC 120 is arranged in the DDR5 PMIC 120. This is consistent with certain functional aspects of the P-DIMM PMIC 152 being different from those of the DDR5 PMIC 120. For example, the P-DIMM PMIC 152 does not wait to be instructed (by, e.g., a host memory controller) to power up the power rails to its memory components. Rather, the P-DIMM PMIC 152 powers up its P-DIMM power rails 164 without the involvement of the BIOS of the platform. In this sense, the P-DIMM PMIC 152 engages in "autonomous" power up of the P-DIMM power rails 164. In addition, the P-DIMM PMIC 152 is more secure than the DDR5 PMIC 120, since the P-DIMM PMIC 152 is situated behind the P-DIMM memory controller 150 and therefore cannot be accessed directly by the platform.

And while those aspects are certainly advantages in many ways, it is also the case that the automatic-and-autonomous power up conducted by the P-DIMM PMIC 152 can cause an issue if there is a critical fault in connection with the P-DIMM1 146. As stated above, in many implementations, a critical fault being present on a component such as a DIMM is a situation in which the associated platform will shut itself down, prevent itself from booting up (other than in a "safe mode" in some implementations), and/or the like. Because P-DIMMs such as the P-DIMM1 146 are configured to (automatically) activate their power rails upon simply receiving (or detecting, etc.) a threshold amount of input voltage, a repeating critical fault will continue to occur, and the associated system will be stuck in a state from which it is not able to boot up normally. To address this and other shortcomings and drawbacks of prior implementations, disclosed herein are embodiments of systems and methods for self-isolation of PMICs of memory modules, including but not limited to self-isolation of PMICs of P-DIMMs, under and in response to fault conditions (in connection with, e.g., one or more connected platforms, systems, devices, and/or the like). Furthermore, it is noted that the herein-disclosed self-isolation of a given PMIC of a given P-DIMM can just as well be thought of as self-isolation of the given P-DIMM itself.

As described herein, in the case of a critical fault and without BIOS involvement, a P-DIMM in accordance with at least some embodiments of the present disclosure self-isolates from a platform in which it has been installed. One or more embodiments make use of an NVM-based fault-recording mechanism to achieve this. In some embodiments, this mechanism is referred to as a Multiple-Time Programming (MTP)/NVM fault-recording mechanism. Furthermore, in some embodiments, not only are various faults recorded, but a P-DIMM also distinguishes between (i) critical faults such as output-rail OVP, output-rail UVP, output-rail OCP, critical-temperature conditions, and/or the like and (ii) other faults (e.g., typical input-voltage faults) that are not considered critical in at least some implementations. As is more fully described below, in at least some embodiments, PMIC RTL logic includes, within a fault code, an indicator (e.g., a flag bit) that is designated to identify (previously occurred) faults as having been "critical faults" or "non-critical faults." Such an indicator may generally be referred to in this disclosure as a "critical-fault indicator." Such an indicator may also be referred to herein at times as a "previous-critical-fault indicator," since it indicates whether or not a critical fault had previously occurred.

Figure 2:
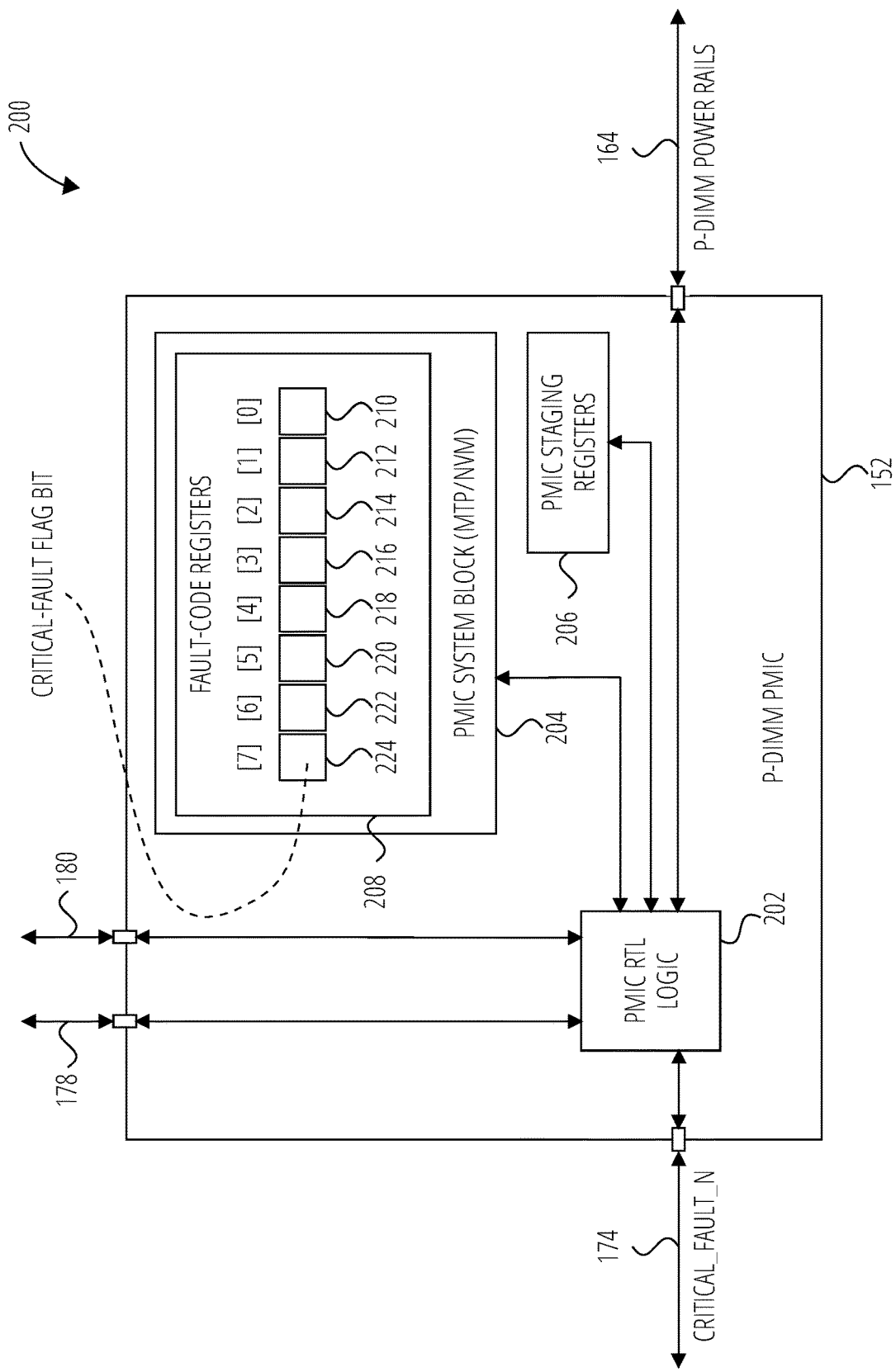
FIG. 2 depicts an example architecture of the example PMIC of the example persistent-storage DIMM of FIG. 1, in accordance with at least one embodiment.

FIG. 2 depicts an example PMIC architecture 200 of the example P-DIMM PMIC 152 of the example P-DIMM1 146 of FIG. 1, in accordance with at least one embodiment. The PMIC architecture 200 is provided by way of example and not limitation, as other architectures could be implemented in various different embodiments. As depicted in FIG. 2, the PMIC architecture 200 of the P-DIMM PMIC 152 includes PMIC RTL logic 202, a PMIC system block 204, and PMIC staging registers 206.

The PMIC RTL logic 202 is connected via the data link 178 and the I2C bus 180 to the P-DIMM memory controller 150, as depicted in FIG. 1. Furthermore, the PMIC RTL logic 202 is connected via the CRITICAL_FAULT_N signal pin 174 to the data bus 182, and is further connected to the P-DIMM power rails 164, all of which is also consistent with the platform architecture 100 of FIG. 1. In an embodiment, the P-DIMM PMIC 152 executes the PMIC RTL logic 202 to perform one or more operations described herein, such as one or more of the operations shown in the state-transition logic 400 of FIG. 4 and/or one or more of the operations shown in the method 600 of FIG. 6, as examples. Furthermore, at various different times, the PMIC system block 204 and/or the PMIC staging register 206 may store data similar to the example data that is shown in connection with the fault-code-register log 300 of FIG. 3 and/or in connection with the NVM erase/write sequence 500 of FIG. 5.

The PMIC system block 204 includes fault-code registers 208. For simplicity, only one set of eight fault-code registers 208 is shown in FIG. 2, though there could be any number of sets of fault-code registers that is deemed suitable for a given implementation by those of skill in the art. As can be seen in FIG. 2, the depicted fault-code registers 208 correspond respectively to bit[7] through bit[0] of an example fault code. In particular, the depicted fault-code registers 208 include a critical-fault flag bit 224 (corresponding to bit[7]), as well as a fault-code-register bit[6] 222, a fault-code-register bit[5] 220, a fault-code-register bit[4] 218, a fault-code-register bit[3] 216, a fault-code-register bit[2] 214, a fault-code-register bit[1] 212, and a fault-code-register bit[0] 210. Some example uses of these registers and the PMIC staging registers 206 are described below.

Some embodiments of the present disclosure involve generating data records in the form of what is referred to herein as a "fault-code-register log" (or "fault log," for short). FIG. 3 depicts an example fault-code-register log 300 that may be maintained by the P-DIMM PMIC 152 of the P-DIMM1 146 of FIG. 1, in accordance with at least one embodiment. As shown in FIG. 3, the example fault-code-register log 300 includes a critical-fault-bit column 302, multiple fault-code-bit columns 304, and a fault-description column 306. The fault-description column 306 is shown in FIG. 3 to assist the reader, and, in at least one embodiment of the present disclosure, is not actually present (i.e., is not actually stored in the PMIC system block 204 or the PMIC staging register 206 (in, e.g., the fault-code register 208), as examples).

In the depicted embodiment, each of the eight data rows in the fault-code-register log 300 includes a critical-fault flag bit 224 in the critical-fault-bit column 302, and further includes bits in the fault-code-bit columns 304 that correspond from left to right with the fault-code-register bit[6] 222 through fault-code-register bit[0] 210 of FIG. 2. It can be seen in the depicted embodiment that a "1" is used (i.e., the bit is "set") in the critical-fault-bit column 302 to indicate that the associated row corresponds to a critical fault, whereas a "0" is used (i.e., the bit is "clear") to indicate that the associated row corresponds to a non-critical fault. As examples, both a first-row critical-fault bit 308 and a third-row critical-fault bit 312 are set, whereas a second-row critical-fault bit 310 is clear. The choice of bit[7] to be the herein-described critical-fault-flag bit (or more generally a critical-fault indicator) is arbitrary—any bit position could be used for this purpose. Moreover, the string of the bits [6:0] may correspond to codes that uniquely identify various critical and non-critical faults. Other configurations and conventions could be used as well.

It can be seen in FIG. 3 that the first and third rows were considered by the operational logic to be associated with critical faults, whereas the second row was not. (The remaining five rows are still in an initialized state.) It can be seen from the fault-description column 306 on the right that the first and third rows correspond to a UVP fault on an output rail "A" and an OVP fault on an output rail "H," respectively. Furthermore, the second row is associated with a (non-critical) input-voltage OVP fault. These examples are provided by way of illustration and not limitation.

Figure 4:
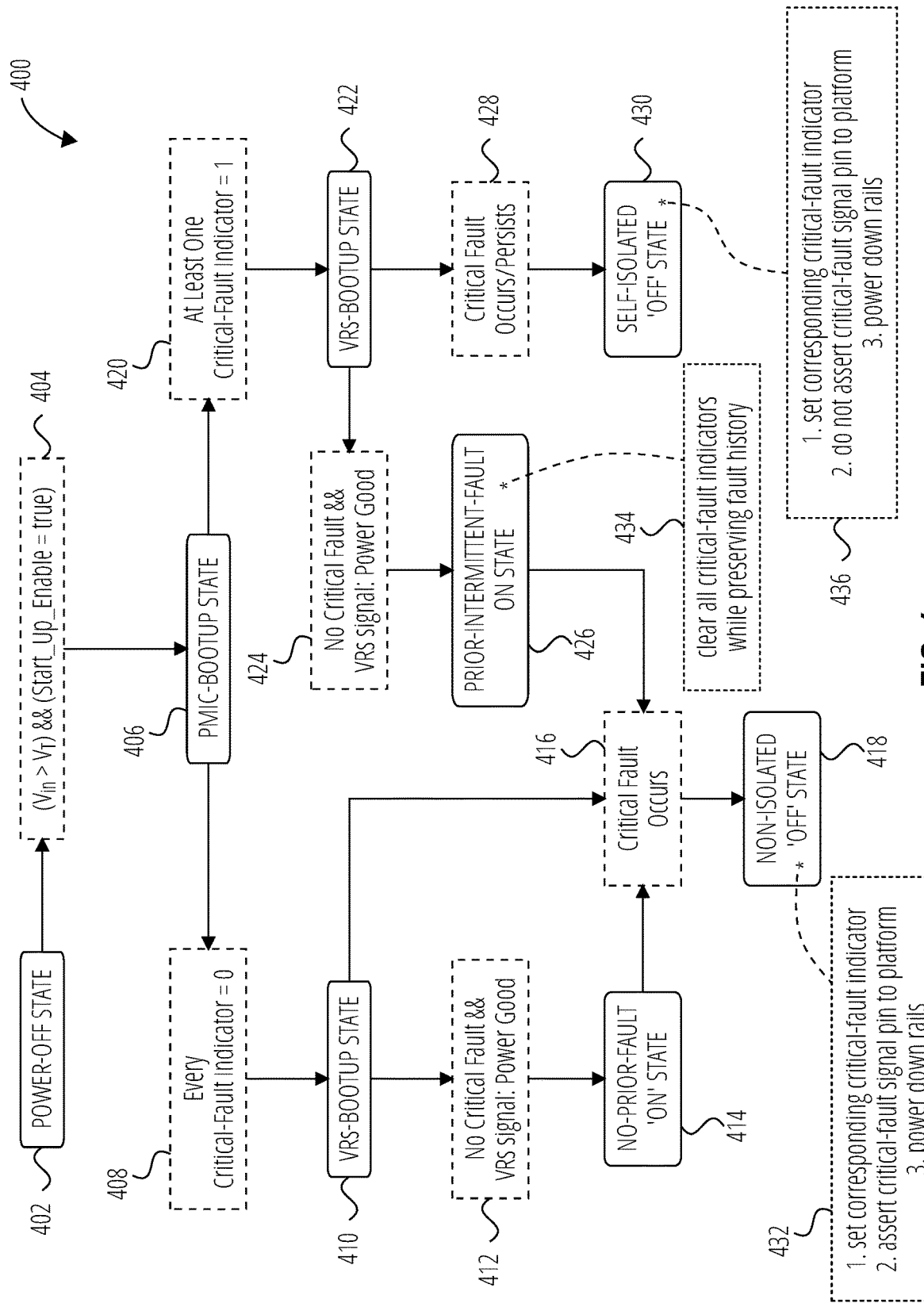
FIG. 4 depicts example state-transition logic that may be executed by the example PMIC of the example persistent-storage DIMM of FIG. 1, in accordance with at least one embodiment.

FIG. 4 depicts example state-transition logic 400 that may be executed by the P-DIMM PMIC 152 of the P-DIMM1 146 of FIG. 1, in accordance with at least one embodiment. In FIG. 4, the states are represented by rounded-corner rectangles having solid-line borders and having their text in all capital letters, whereas conditions that effect state transitions are represented as rectangles having dashed-line borders and having their text in a mix of capital and lowercase letters. Furthermore, there are three boxes 432, 434, and 436 having small-dashed-line borders and having their text in all lowercase letters; those three boxes 432, 434, and 436 list one or more operations carried out by the P-DIMM PMIC 152 when in the corresponding state.

In various different embodiments, state-transition logic such as the state-transition logic 400 may be executed by various different components of the P-DIMM1 146, such as the P-DIMM memory controller 150 and/or the P-DIMM PMIC 152, as examples. In some embodiments, the state-transition logic 400 is performed by only one such component. As another example, in some embodiments, the state-transition logic 400 is performed by the PMIC RTL logic 202 of the P-DIMM PMIC 152 in cooperation with firmware of the P-DIMM memory controller 150. For ease of explanation, and not by way of limitation, the state-transition logic 400 is described below as being performed by the P-DIMM PMIC 152.

The state-transition logic 400 begins at a power-off state 402, which could be reached after a shutdown, or which could be reached temporarily as part of a restart/reboot sequence, and/or the like. The P-DIMM PMIC 152 transitions from the power-off state 402 to a PMIC-bootup state 406 upon the occurrence of a condition 404, which is that (i) the input voltage (Vin) of the P-DIMM PMIC 152 exceeds a threshold voltage (VT) and (ii) a start_up_enable_flag is set to true. These are example conditions, and in some embodiments only the first of those two aspects of the condition 404 is present.

When in the PMIC-bootup state 406, the P-DIMM PMIC 152 may check whether any of one or more fault codes being stored by the P-DIMM PMIC 152 have their associated critical-fault flag bit 224 set (e.g., equal to 1). This portion of the state-transition logic 400 corresponds in some embodiments with the below-described decision block 606 in the method 600, at which the P-DIMM1 146, P-DIMM PMIC 152, and/or the like determines whether or not at least one critical-fault indicator is set.

If it is the case while in the PMIC-bootup state 406 that it is determined that each of the one or more critical-fault-flag bits (i.e., the bit[7]s in the depicted and described embodiments) is clear, that corresponds to the presence of the condition 408, which transitions the P-DIMM PMIC 152 to a VRs-bootup state 410. When in the VRs-bootup state 410, the P-DIMM PMIC 152 powers up the P-DIMM power rails 164, which is a task that can last on the order of 40-50 milliseconds (ms) or so. During the performance of that task, a condition 412 corresponds to (i) a lack of any critical fault occurring and (ii) detecting that the P-DIMM power rails 164 indicate having suitable power. If this condition 412 holds during the time needed to power the P-DIMM power rails 164 while in the VRs-bootup state 410, the P-DIMM PMIC 152 transitions to a no-prior-fault ON state 414. If, however, a critical fault does occur while the P-DIMM PMIC 152 is in the VRs-bootup state 410, that corresponds to the presence of a condition 416, and the P-DIMM PMIC 152 instead accordingly transitions to a non-isolated OFF state 418.

Being in the no-prior-fault ON state 414 therefore corresponds to (i) a normal bootup process having been conducted, (ii) no critical faults having yet occurred during the current cycle of the P-DIMM1 146 (i.e., while the P-DIMM PMIC 152 is currently operating subsequent to its most recent time being in the power-off state 402), and (iii) no critical fault having occurred in the preceding cycle (or, more generally in some embodiments, a prior cycle) of the P-DIMM1 146 (i.e., the time in which the P-DIMM1 146 was in operation subsequent to the second-most-recent time that the P-DIMM PMIC 152 was in the power-off state 402 and prior to the most recent time that the P-DIMM PMIC 152 was in the power-off state 402). When in the no-prior-fault ON state 414, the P-DIMM PMIC 152 may maintain the CRITICAL_FAULT_N signal pin 174 in a state of high-impedance, which may involve "floating" the CRITICAL_FAULT_N signal pin 174. The P-DIMM1 146 may then continue normal operation, and at some point perhaps be turned off (and later back on) or restarted, either of which will place the P-DIMM PMIC 152 back in the power-off state 402. If, however, a critical fault occurs, that corresponds to the presence of the aforementioned condition 416, and the P-DIMM PMIC 152 transitions to the aforementioned non-isolated OFF state 418.

Returning for a moment to the PMIC-bootup state 406, it could occur that at least one of the one or more critical-fault-flag bits being maintained by the P-DIMM PMIC 152 is set, corresponding to the presence of a condition 420, which transitions the P-DIMM PMIC 152 to a VRs-bootup state 422. The VRs-bootup state 422 is substantively quite similar or perhaps identical to the VRs-bootup state 410, and therefore is not described in detail here. Similar to the time during which the P-DIMM PMIC 152 is in the VRs-bootup state 410, the time during which the P-DIMM PMIC 152 is in the VRs-bootup state 422 can involve either (i) no critical faults and a sufficient-power indication from the P-DIMM power rails 164 (i.e., the presence of a condition 424) or (ii) the occurrence (or in this case, recurrence) of a critical fault, which would correspond to the presence of a condition 428. The presence of the condition 424 transitions the P-DIMM PMIC 152 to a prior-intermittent-fault ON state 426, whereas the presence of the condition 428 transitions the P-DIMM PMIC 152 to a self-isolated OFF state 430.

The P-DIMM PMIC 152 being in the prior-intermittent-fault ON state 426 corresponds, then, to a successful, critical-fault-free bootup during a cycle that follows a cycle in which a critical fault did occur. In other words, being in the prior-intermittent-fault ON state 426 can correspond to having rebooted following the occurrence of (what turns out to be) a non-persistent (a.k.a. "intermittent") fault. When in the prior-intermittent-fault ON state 426, the P-DIMM1 146 may conduct normal I/O operations with the platform. Moreover, in at least one embodiment, when in the prior-intermittent-fault ON state 426, the P-DIMM PMIC 152 performs one or more of what are referred to herein as "PMIC operations," including clearing all of the one or more critical-fault-flag bits being maintained by the P-DIMM PMIC 152, as shown at the box 434. One purpose of that PMIC operation is to place the P-DIMM PMIC 152 in a state that is similar to a state that it would be in if a critical fault had not happened during the previous cycle. This sets up the P-DIMM PMIC 152 to consider any later-occurring critical fault to be a first occurrence, rather than a repeat occurrence, of that later-occurring critical fault, which may turn out to be intermittent, but which instead may turn out to be persistent (i.e., repeating).

As is also mentioned in the box 434, in at least one embodiment, the P-DIMM PMIC 152 performs the clearing of all of the critical-fault flag bits in a manner that preserves the fault-history information that is stored in the various rows of the fault-code-register log 300 in fault-code-register bit[6] 222 through fault-code-register bit[0] 210. In some implementations, the P-DIMM PMIC 152 has a limited set of read/write functions that it can perform with respect to the PMIC system block 204, which is where the fault-code register 208 stores the above-described fault codes, including the above-described bit[7]s (i.e., the critical-fault-flag bits). In such implementations, the P-DIMM PMIC 152 may use a temporary storage location such as the PMIC staging register 206 to accomplish the clearing of the one or more critical-fault-flag bits in a manner that preserves the information in fault-code-register bit[6] 222 through fault-code-register bit[0] 210 in one or more rows of the fault-coderegister log 300. An example sequence of this type of procedure is depicted in the example NVM erase/write sequence 500 of FIG. 5.

Figure 5:
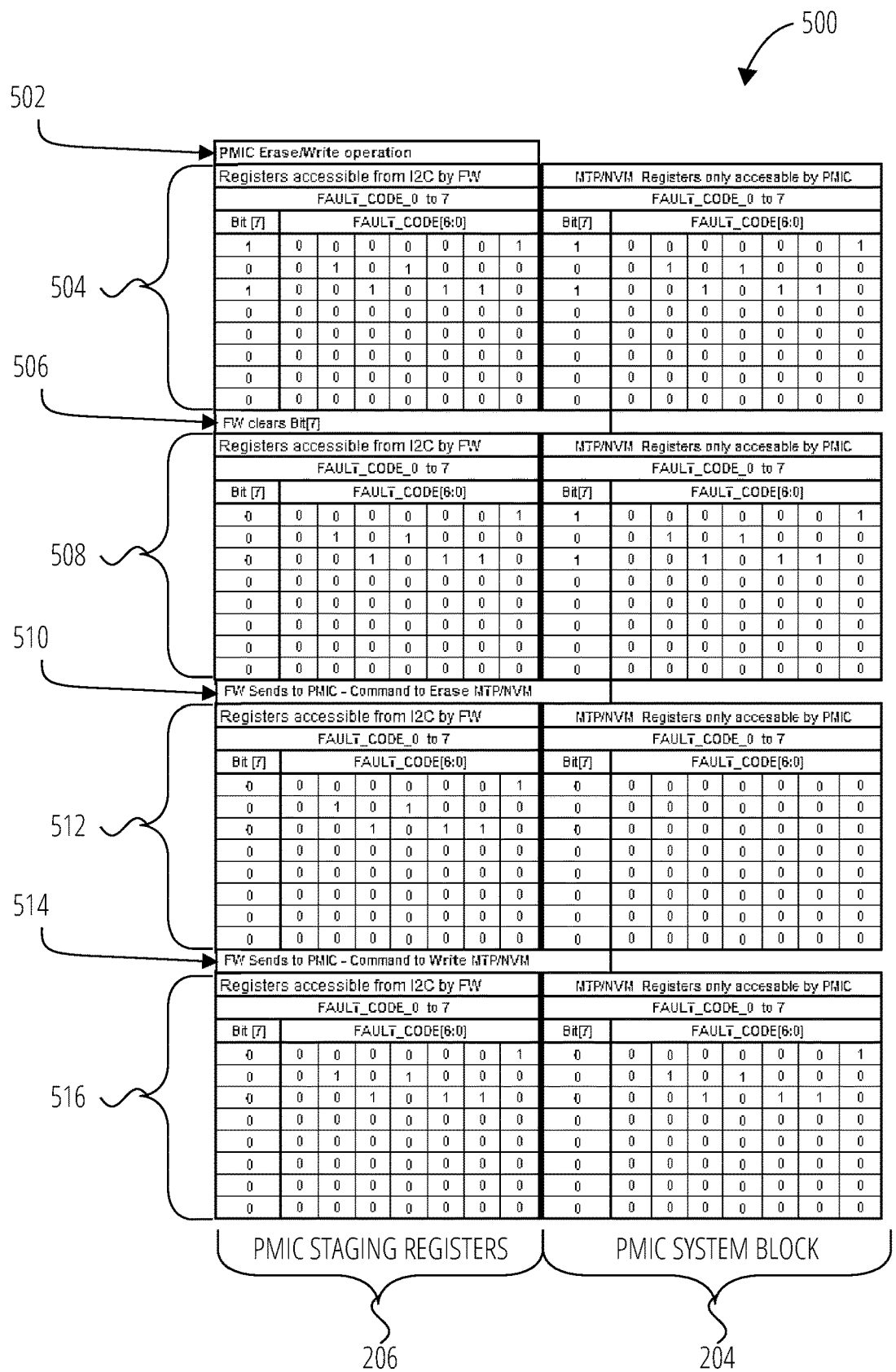
FIG. 5 depicts an example erase/write sequence that may be performed by the example PMIC of the example persistent-storage DIMM of FIG. 1, in accordance with at least one embodiment.

In FIG. 5, the registers displayed in the left-hand column correspond to the PMIC staging registers 206, whereas the registers displayed in the right-hand column correspond to the PMIC system block 204. In this described embodiment, the P-DIMM PMIC 152 has more flexibility (e.g., granularity) when reading from, writing to, and erasing the PMIC staging registers 206 than when reading from, writing to, and erasing the PMIC system block 204, which may only be able to be read and written in fixed-size pages in at least some embodiments.

In some embodiments, upon powering up (e.g., upon arriving in the PMIC-bootup state 406, the VRs-bootup state 410, or the VRs-bootup state 422, or at a different time), the P-DIMM PMIC 152 "dumps" (i.e., copies) the contents of the PMIC system block 204 into the PMIC staging registers 206. The register status 504 shows the contents of the PMIC staging registers 206 and the PMIC system block 204 after this initial copy operation.

When making a change such as clearing one or more critical-fault-flag bits, the P-DIMM PMIC 152 may change one or more individual registers (e.g., the register holding the critical-fault flag bit 224) from "1" to "0" (i.e., clear one or more individual registers). That is represented in FIG. 5 as the operation 506 (i.e., clearing bit[7]), which results in the contents of the PMIC staging registers 206 and the PMIC system block 204 being consistent with what is shown at the register status 508. In the register status 508, it can be seen that the bit[7]s are all clear on the left (i.e., in the PMIC staging registers 206) and still in their original state on the right (i.e., in the PMIC system block 204).

After—though it could be before—the P-DIMM PMIC 152 has the data the way it wants it in the PMIC staging registers 206 (i.e., the register status 508), the P-DIMM PMIC 152 may erase the contents of the PMIC system block 204. This is indicated at the operation 510 (i.e., sending a command to erase the MTP/NVM (which as described above corresponds to the PMIC system block 204)). This results in the PMIC staging registers 206 and the PMIC system block 204 having the content shown in the register status 512, where it can be seen that the PMIC staging registers 206 still have the values that they had in the register status 508, but where the PMIC system block 204 has had all of its registers cleared.

Next, now that the P-DIMM PMIC 152 has modified the data in the PMIC staging registers 206 and has cleared the data that had been in the PMIC system block 204, the P-DIMM PMIC 152 next performs an operation 514, which corresponds to a command to write from the PMIC staging registers 206 to the PMIC system block 204. The result of that operation is shown in the register status 516, where the contents of the PMIC system block 204 and the contents of the PMIC staging registers 206 once again match. Throughout all of these manipulations, the values in the bits [6:0] were preserved, and the values in the bit[7]s (i.e., the critical-fault-flag bits) were cleared. Thus, an accurate record of the faults that occurred in the preceding cycle is preserved, and the critical-fault-flag bits have been reset (i.e., cleared), ready for their next use.

Turning back to the state-transition logic 400 of FIG. 4, the two "OFF" states are now described, first being the non-isolated OFF state 418, the second being the self-isolated OFF state 430. The P-DIMM PMIC 152 can reach the non-isolated OFF state 418 in either of two ways. The first of the two ways of reaching the non-isolated OFF state 418 is that a critical fault occurred in the current cycle but not in the previous cycle. This corresponds to one of the following two sequences occurring: (1) the power-off state 402, the condition 404, the PMIC-bootup state 406, the condition 408, the VRs-bootup state 410, the condition 412, the no-prior-fault ON state 414, the condition 416, and the non-isolated OFF state 418; or (2) the power-off state 402, the condition 404, the PMIC-bootup state 406, the condition 408, the VRs-bootup state 410, the condition 416, and the non-isolated OFF state 418.

The way of reaching the non-isolated OFF state 418 has two parts. The first-in-time of those two parts is that a critical fault did occur in the previous cycle, and then it turned out to be a non-repeating (a.k.a. non-persistent, transient, etc.) critical fault—in other words, it basically happened in the previous cycle and then went away. This corresponds to the sequence: the power-off state 402, the condition 404, the PMIC-bootup state 406, the condition 420, the VRs-bootup state 422, the condition 424, and the prior-intermittent-fault ON state 426. The second-in-time part corresponds simply with the sequence: the prior-intermittent-fault ON state 426, the condition 416, and the non-isolated OFF state 418.

Those two ways of reaching the non-isolated OFF state 418 are treated in the same way by the P-DIMM PMIC 152. Thus, it matters not whether no critical fault or a non-persistent critical fault occurred in the preceding cycle. When in the non-isolated OFF state 418, in at least one embodiment, the P-DIMM PMIC 152 performs the PMIC operations that are listed in the box 432 in FIG. 4, which are also the PMIC operations that are listed in the "No" branch of the decision block 606 in FIG. 6. In particular, the P-DIMM PMIC 152 sets the critical-fault-flag bit that corresponds to the critical fault that occurred at condition 416 (operation 608), asserts (e.g., drives low) the CRITICAL_FAULT_N signal pin 174 to cause a shutdown of the platform (operation 610), and powers down its own P-DIMM power rails 164 (operation 612).

The self-isolated OFF state 430 is reachable in only one way in the state-transition logic 400. This corresponds with a critical fault occurring in the preceding cycle and recurring during the attempt to power up the P-DIMM power rails 164 in the VRs-bootup state 422 during the current cycle. This corresponds to the sequence: the power-off state 402, the condition 404, the PMIC-bootup state 406, the condition 420, the VRs-bootup state 422, the condition 428, and the self-isolated OFF state 430. When in the self-isolated OFF state 430, in at least one embodiment, the P-DIMM PMIC 152 performs the PMIC operations that are listed in the box 436 in FIG. 4, which are also the PMIC operations that are listed in the "Yes" branch of the decision block 606 of FIG. 6. In particular, the P-DIMM PMIC 152 sets the critical-fault-flag bit that corresponds to the critical fault that occurred at condition 416 (operation 614), does not assert (e.g., floats) the CRITICAL_FAULT_N signal pin 174 (operation 616), and powers down its own P-DIMM power rails 164 (operation 618).

It is noted that, as between the non-isolated OFF state 418 and the self-isolated OFF state 430, both involve setting the critical-fault-flag bit (operation 608; operation 614) and powering down the P-DIMM power rails 164 (operation 612; operation 618). They are different at least in that the non-isolated OFF state 418 involves asserting the CRITICAL_FAULT_N signal pin 174 (operation 610) whereas the self-isolated OFF state 430 does not (operation 616). The operation 616 may sound like it is not an operation, in that it involves not doing something (i.e., not asserting the CRITICAL_FAULT_N signal pin 174), but in at least one embodiment the operation 616 includes the operation of floating the CRITICAL_FAULT_N signal pin 174 so as to leave the shutdown or not of the platform to the other DIMMs in the platform. When the P-DIMM PMIC 152 is in the self-isolated OFF state 430, in at least one embodiment, the platform will attempt to reach it but get no reply, and thereby be able to identify the P-DIMM1 146 as the P-DIMM that is experiencing a repeated critical fault. Importantly, the platform will be able to successfully reboot, which it would not be able to do without the self-isolation approach of various embodiments of the present disclosure.

Figure 6:
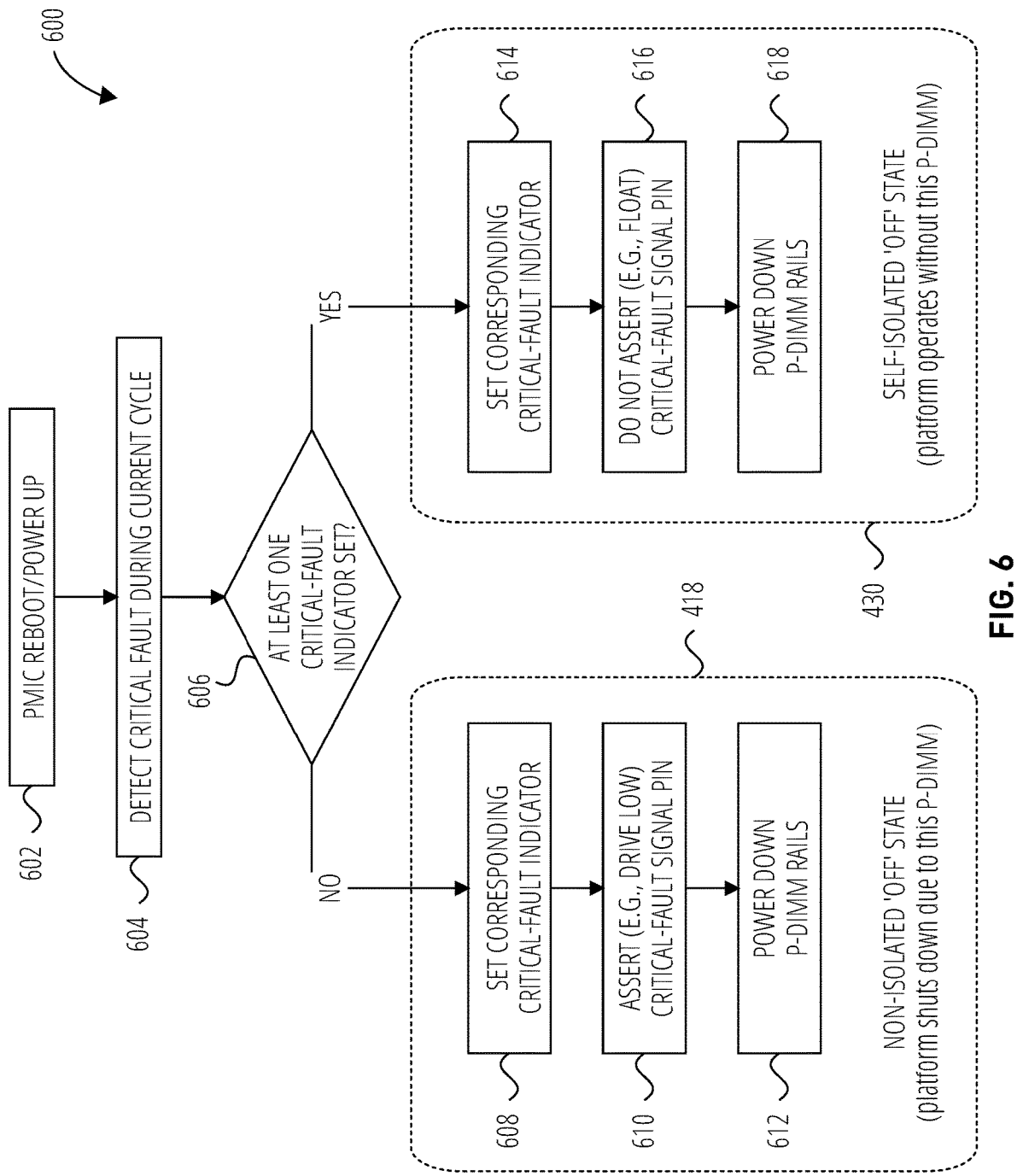
FIG. 6 depicts an example method that may be performed by the example PMIC of the example persistent-storage DIMM of FIG. 1, in accordance with at least one embodiment.

FIG. 6 depicts an example method 600 that may be performed by the P-DIMM PMIC 152 of the P-DIMM1 146 of FIG. 1, in accordance with at least one embodiment. The various operations of the method 600 are described above in connection with descriptions of analogous and/or corresponding aspects of other figures. As such, the method 600 is not redundantly described in detail here.

Figure 7:
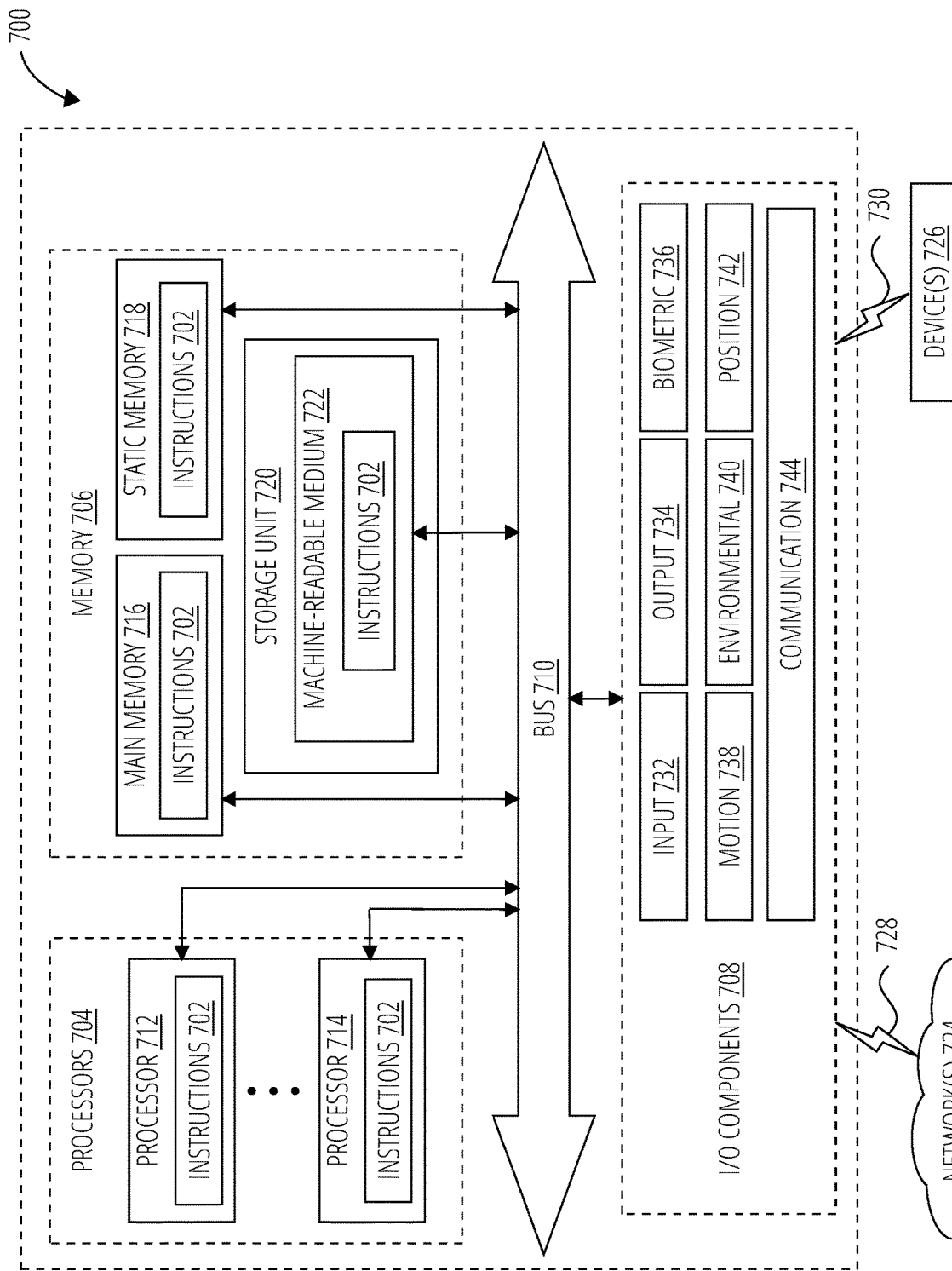
FIG. 7 depicts an example computer system, in accordance with at least one embodiment.

FIG. 7 depicts an example computer system 700 within which instructions 702 (e.g., software, firmware, a program, an application, an applet, an app, a script, a macro, and/or other executable code) for causing the computer system 700 to perform any one or more of the methodologies discussed herein may be executed. In at least one embodiment, execution of the instructions 702 causes the computer system 700 to perform one or more of the methods described herein. In at least one embodiment, the instructions 702 transform a general, non-programmed computer system into a particular computer system 700 programmed to carry out the described and illustrated functions. The computer system 700 may operate as a standalone device or may be coupled (e.g., networked) to and/or with one or more other devices, machines, systems, and/or the like. In a networked deployment, the computer system 700 may operate in the capacity of a server and/or a client in one or more server-client relationships, and/or as one or more peers in a peer-to-peer (or distributed) network environment.

The computer system 700 may be or include, but is not limited to, one or more of each of the following: a server computer or device, a client computer or device, a personal computer (PC), a tablet, a laptop, a netbook, a set-top box (STB), a personal digital assistant (PDA), an entertainment media system, a cellular telephone, a smartphone, a mobile device, a wearable (e.g., a smartwatch), a smart-home device (e.g., a smart appliance), another smart device (e.g., an Internet of Things (IoT) device), a web appliance, a network router, a network switch, a network bridge, and/or any other machine capable of executing the instructions 702, sequentially or otherwise, that specify actions to be taken by the computer system 700. And while only a single computer system 700 is illustrated, there could just as well be a collection of computer systems that individually or jointly execute the instructions 702 to perform any one or more of the methodologies discussed herein.

As depicted in FIG. 7, the computer system 700 may include processors 704, memory 706, and I/O components 708, which may be configured to communicate with each other via a bus 710. In an example embodiment, the processors 704 (e.g., a central processing unit (CPU), a Reduced Instruction Set Computing (RISC) processor, a Complex Instruction Set Computing (CISC) processor, a graphics processing unit (GPU), a digital signal processor (DSP), an application-specific integrated circuit (ASIC), a radio-frequency integrated circuit (RFIC), another processor, and/or any suitable combination thereof) may include, as examples, a processor 712 and a processor 714 that execute the instructions 702. The term "processor" is intended to include multi-core processors that may include two or more independent processors (sometimes referred to as "cores") that may execute instructions contemporaneously. Although FIG. 7 shows multiple processors 704, the computer system 700 may include a single processor with a single core, a single processor with multiple cores (e.g., a multi-core processor), multiple processors with a single core, multiple processors with multiples cores, or any combination thereof.

The memory 706, as depicted in FIG. 7, includes a main memory 716, a static memory 718, and a storage unit 720, each of which is accessible to the processors 704 via the bus 710. The memory 706, the static memory 718, and/or the storage unit 720 may store the instructions 702 executable for performing any one or more of the methodologies or functions described herein. The instructions 702 may also or instead reside completely or partially within the main memory 716, within the static memory 718, within machine-readable medium 722 within the storage unit 720, within at least one of the processors 704 (e.g., within a cache memory of a given one of the processors 704), and/or any suitable combination thereof, during execution thereof by the computer system 700. In at least one embodiment, the machine-readable medium 722 includes one or more non-transitory computer-readable storage media.

Furthermore, also as depicted in FIG. 7, I/O components 708 may include a wide variety of components to receive input, produce and/or provide output, transmit information, exchange information, capture measurements, and/or the like. The specific I/O components 708 that are included in a particular instance of the computer system 700 will depend on the type of machine. For example, portable machines such as mobile phones may include a touch input device or other such input mechanisms, while a headless server machine may not include such a touch input device. Moreover, the I/O components 708 may include many other components that are not shown in FIG. 7.

In various example embodiments, the I/O components 708 may include input components 732 and output components 734. The input components 732 may include alphanumeric input components (e.g., a keyboard, a touchscreen configured to receive alphanumeric input, a photo-optical keyboard, and/or other alphanumeric input components), pointing-based input components (e.g., a mouse, a touchpad, a trackball, a joystick, a motion sensor, and/or one or more other pointing-based input components), tactile input components (e.g., a physical button, a touchscreen that is responsive to location and/or force of touches or touch gestures, and/or one or more other tactile input components), audio input components (e.g., a microphone), and/or the like. The output components 734 may include visual components (e.g., a display such as a plasma display panel (PDP), a light emitting diode (LED) display, a liquid crystal display (LCD), a projector, and/or a cathode ray tube (CRT)), acoustic components (e.g., speakers), haptic components (e.g., a vibratory motor, resistance mechanisms), other signal generators, and so forth.

In further example embodiments, the I/O components 708 may include, as examples, biometric components 736, motion components 738, environmental components 740, and/or position components 742, among a wide array of possible components. As examples, the biometric components 736 may include components to detect expressions (e.g., hand expressions, facial expressions, vocal expressions, body gestures, eye tracking, and/or the like), measure biosignals (e.g., blood pressure, heart rate, body temperature, perspiration, brain waves, and/or the like), identify a person (by way of, e.g., voice identification, retinal identification, facial identification, fingerprint identification, electroencephalogram-based identification and/or the like), etc. The motion components 738 may include acceleration-sensing components (e.g., an accelerometer), gravitation-sensing components, rotation-sensing components (e.g., a gyroscope), and/or the like.

The environmental components 740 may include, as examples, illumination-sensing components (e.g., a photometer), temperature-sensing components (e.g., one or more thermometers), humidity-sensing components, pressure-sensing components (e.g., a barometer), acoustic-sensing components (e.g., one or more microphones), proximity-sensing components (e.g., infrared sensors, millimeter-(mm)-wave radar) to detect nearby objects), gas-sensing components (e.g., gas-detection sensors to detect concentrations of hazardous gases for safety and/or to measure pollutants in the atmosphere), and/or other components that may provide indications, measurements, signals, and/or the like that correspond to a surrounding physical environment. The position components 742 may include location-sensing components (e.g., a Global Navigation Satellite System (GNSS) receiver such as a Global Positioning System (GPS) receiver), altitude-sensing components (e.g., altimeters and/or barometers that detect air pressure from which altitude may be derived), orientation-sensing components (e.g., magnetometers), and/or the like.

Communication may be implemented using a wide variety of technologies. The I/O components 708 may further include communication components 744 operable to communicatively couple the computer system 700 to one or more networks 724 and/or one or more devices 726 via a coupling 728 and/or a coupling 730, respectively. For example, the communication components 744 may include a network-interface component or another suitable device to interface with a given network 724. In further examples, the communication components 744 may include wired-communication components, wireless-communication components, cellular-communication components, Near Field Communication (NFC) components, Bluetooth (e.g., Bluetooth Low Energy) components, Wi-Fi components, and/or other communication components to provide communication via one or more other modalities. The devices 726 may include one or more other machines and/or any of a wide variety of peripheral devices (e.g., a peripheral device coupled via a universal serial bus (USB) connection).

Moreover, the communication components 744 may detect identifiers or include components operable to detect identifiers. For example, the communication components 744 may include radio frequency identification (RFID) tag reader components, NFC-smart-tag detection components, optical-reader components (e.g., an optical sensor to detect one-dimensional bar codes such as Universal Product Code (UPC) bar codes, multi-dimensional bar codes such as Quick Response (QR) codes, Aztec codes, Data Matrix, Dataglyph, MaxiCode, PDF417, Ultra Code, UCC RSS-2D bar codes, and/or other optical codes), and/or acoustic-detection components (e.g., microphones to identify tagged audio signals). In addition, a variety of information may be derived via the communication components 744, such as location via IP geolocation, location via Wi-Fi signal triangulation, location via detecting an NFC beacon signal that may indicate a particular location, and/or the like.

One or more of the various memories (e.g., the memory 706, the main memory 716, the static memory 718, and/or the (e.g., cache) memory of one or more of the processors 704) and/or the storage unit 720 may store one or more sets of instructions (e.g., software) and/or data structures embodying or used by any one or more of the methodologies or functions described herein. These instructions (e.g., the instructions 702), when executed by one or more of the processors 704, cause performance of various operations to implement various embodiments of the present disclosure.

The instructions 702 may be transmitted or received over one or more networks 724 using a transmission medium, via a network-interface device (e.g., a network-interface component included in the communication components 744), and using any one of a number of transfer protocols (e.g., the Session Initiation Protocol (SIP), the HyperText Transfer Protocol (HTTP), and/or the like). Similarly, the instructions 702 may be transmitted or received using a transmission medium via the coupling 730 (e.g., a peer-to-peer coupling) to one or more devices 726. In some embodiments, IoT devices can communicate using Message Queuing Telemetry Transport (MQTT) messaging, which can be relatively more compact and efficient.

In view of the disclosure above, a listing of various examples of embodiments is set forth below. It should be noted that one or more features of an example, taken in isolation or combination, should be considered to be within the disclosure of this application.

Example 1 is a power-management integrated circuit (PMIC) including: a PMIC interface configured to be operably engaged with a memory module that is operably engaged with a platform, the memory module including a non-volatile-memory block having a memory-block power supply controlled by the PMIC; a critical-fault signal pin, the assertion of which causes the platform to shut down; and PMIC control logic executable to perform PMIC operations including: determining whether an indicator set of one or more non-volatile critical-fault indicators indicates that at least one prior-cycle critical fault occurred during a prior cycle of operation; determining whether a current-cycle critical fault occurs during an automatic bootup sequence of the memory-block power supply during a current cycle of operation; and based on determining that (i) the indicator set indicates that at least one prior-cycle critical fault occurred and (ii) a current-cycle critical fault does occur during the automatic bootup sequence: setting, in the critical-fault-indicator set, a critical-fault indicator corresponding to the occurrence of the current-cycle critical fault; powering down the memory-block power supply; and not asserting the critical-fault signal pin to the platform.

Example 2 is the PMIC of Example 1, the PMIC operations further including clearing each non-volatile critical-fault indicator in the indicator set based on determining that (i) the indicator set indicates that at least one prior-cycle critical fault occurred and (ii) a current-cycle critical fault does not occur during the automatic bootup sequence, the memory module being available to the platform for input/output operations after completion of the automatic bootup sequence.

Example 3 is the PMIC of Example 2, the PMIC operations further including, after clearing each non-volatile critical-fault indicator in the indicator set, detecting a post-bootup current-cycle critical fault, and responsively: setting, in the critical-fault-indicator set, a critical-fault indicator corresponding to the post-bootup current-cycle critical fault; powering down the memory-block power supply; and asserting the critical-fault signal pin to the platform.

Example 4 is the PMIC of any of the Examples 1-3, the PMIC operations further including operating in a normal mode based on determining that (i) the indicator set indicates that no prior-cycle critical faults occurred and (ii) a current-cycle critical fault does not occur during the automatic bootup sequence, the memory module being available to the platform for input/output operations during the normal mode.

Example 5 is the PMIC of Example 4, the PMIC operations further including detecting, during operation in the normal mode, a post-bootup current-cycle critical fault, and responsively: setting, in the critical-fault-indicator set, a critical-fault indicator corresponding to the post-bootup current-cycle critical fault; powering down the memory-block power supply; and asserting the critical-fault signal pin to the platform.

Example 6 is the PMIC of any of the Examples 1-5, the PMIC operations further including, based on determining that (i) the indicator set indicates that no prior-cycle critical faults occurred and (ii) a current-cycle critical fault does occur during the automatic bootup sequence: setting, in the critical-fault-indicator set, a critical-fault indicator corresponding to the post-bootup current-cycle critical fault; powering down the memory-block power supply; and asserting the critical-fault signal pin to the platform.

Example 7 is the PMIC of any of the Examples 1-6, where: the memory module further includes a memory-module controller operably engaged with the platform via a memory-module interface; the memory-module controller is also operably engaged with the PMIC; and both the PMIC and the non-volatile memory block are positioned behind the memory-module controller with respect to the memory-module interface such that neither the PMIC nor the non-volatile memory block is directly accessible to the platform.

Example 8 is a memory module including: a memory-module interface configured to be operably engaged with a platform; a power-management integrated circuit (PMIC); a non-volatile-memory block having a memory-block power supply controlled by the PMIC, the PMIC including a critical-fault signal pin, the assertion of which causes the platform to shut down, the PMIC further including PMIC control logic executable to perform PMIC operations including: determining whether an indicator set of one or more non-volatile critical-fault indicators indicates that at least one prior-cycle critical fault occurred during a prior cycle of operation; determining whether a current-cycle critical fault occurs during an automatic bootup sequence of the memory-block power supply during a current cycle of operation; and based on determining that (i) the indicator set indicates that at least one prior-cycle critical fault occurred and (ii) a current-cycle critical fault does occur during the automatic bootup sequence: setting, in the critical-fault-indicator set, a critical-fault indicator corresponding to the occurrence of the current-cycle critical fault; powering down the memory-block power supply; and not asserting the critical-fault signal pin to the platform.

Example 9 is the memory module of Example 8, the PMIC operations further including clearing each non-volatile critical-fault indicator in the indicator set based on determining that (i) the indicator set indicates that at least one prior-cycle critical fault occurred and (ii) a current-cycle critical fault does not occur during the automatic bootup sequence, the memory module being available to the platform for input/output operations after completion of the automatic bootup sequence.

Example 10 is the memory module of Example 9, the PMIC operations further including, after clearing each non-volatile critical-fault indicator in the indicator set, detecting a post-bootup current-cycle critical fault, and responsively: setting, in the critical-fault-indicator set, a critical-fault indicator corresponding to the post-bootup current-cycle critical fault; powering down the memory-block power supply; and asserting the critical-fault signal pin to the platform.

Example 11 is the memory module of any of the Examples 8-10, the PMIC operations further including operating in a normal mode based on determining that (i) the indicator set indicates that no prior-cycle critical faults occurred and (ii) a current-cycle critical fault does not occur during the automatic bootup sequence, the memory module being available to the platform for input/output operations during the normal mode.

Example 12 is the memory module of Example 11, the PMIC operations further including detecting, during operation in the normal mode, a post-bootup current-cycle critical fault, and responsively: setting, in the critical-fault-indicator set, a critical-fault indicator corresponding to the post-bootup current-cycle critical fault; powering down the memory-block power supply; and asserting the critical-fault signal pin to the platform.

Example 13 is the memory module of any of the Examples 8-12, the PMIC operations further including, based on determining that (i) the indicator set indicates that no prior-cycle critical faults occurred and (ii) a current-cycle critical fault does occur during the automatic bootup sequence: setting, in the critical-fault-indicator set, a critical-fault indicator corresponding to the post-bootup current-cycle critical fault; powering down the memory-block power supply; and asserting the critical-fault signal pin to the platform.

Example 14 is the memory module of any of the Examples 8-13, further including a memory-module controller operably engaged with the memory-module interface and the PMIC, both the PMIC and the non-volatile memory block being positioned behind the memory-module controller with respect to the memory-module interface such that neither the PMIC nor the non-volatile memory block is directly accessible to the platform.

Example 15 is a system including: a platform; and a memory module including a power-management integrated circuit (PMIC), a non-volatile-memory block having a memory-block power supply controlled by the PMIC, and a memory-module interface configured to be operably engaged with the platform, the PMIC including a critical-fault signal pin, the assertion of which causes the platform to shut down, and PMIC control logic executable to perform PMIC operations including: determining whether an indicator set of one or more non-volatile critical-fault indicators indicates that at least one prior-cycle critical fault occurred during a prior cycle of operation; determining whether a current-cycle critical fault occurs during an automatic bootup sequence of the memory-block power supply during a current cycle of operation; and based on determining that (i) the indicator set indicates that at least one prior-cycle critical fault occurred and (ii) a current-cycle critical fault does occur during the automatic bootup sequence: setting, in the critical-fault-indicator set, a critical-fault indicator corresponding to the occurrence of the current-cycle critical fault; powering down the memory-block power supply; and not asserting the critical-fault signal pin to the platform.

Example 16 is the system of Example 15, the PMIC operations further including clearing each non-volatile critical-fault indicator in the indicator set based on determining that (i) the indicator set indicates that at least one prior-cycle critical fault occurred and (ii) a current-cycle critical fault does not occur during the automatic bootup sequence, the memory module being available to the platform for input/output operations after completion of the automatic bootup sequence.

Example 17 is the system of Example 16, the PMIC operations further including, after clearing each non-volatile critical-fault indicator in the indicator set, detecting a post-bootup current-cycle critical fault, and responsively: setting, in the critical-fault-indicator set, a critical-fault indicator corresponding to the post-bootup current-cycle critical fault; powering down the memory-block power supply; and asserting the critical-fault signal pin to the platform.

Example 18 is the system of any of the Examples 15-19, the PMIC operations further including operating in a normal mode based on determining that (i) the indicator set indicates that no prior-cycle critical faults occurred and (ii) a current-cycle critical fault does not occur during the automatic bootup sequence, the memory module being available to the platform for input/output operations during the normal mode.

Example 19 is the system of Example 18, the PMIC operations further including detecting, during operation in the normal mode, a post-bootup current-cycle critical fault, and responsively: setting, in the critical-fault-indicator set, a critical-fault indicator corresponding to the post-bootup current-cycle critical fault; powering down the memory-block power supply; and asserting the critical-fault signal pin to the platform.

Example 20 is the system of any of the Examples 15-19, the PMIC operations further including, based on determining that (i) the indicator set indicates that no prior-cycle critical faults occurred and (ii) a current-cycle critical fault does occur during the automatic bootup sequence: setting, in the critical-fault-indicator set, a critical-fault indicator corresponding to the post-bootup current-cycle critical fault; powering down the memory-block power supply; and asserting the critical-fault signal pin to the platform.

Example 21 is the system of any of the Examples 15-20, the memory module further including a memory-module controller operably engaged with the memory-module interface and the PMIC, both the PMIC and the non-volatile memory block being positioned behind the memory-module controller with respect to the memory-module interface such that neither the PMIC nor the non-volatile memory block is directly accessible to the platform.

Example 22 is a memory module including: a communication interface configured to communicate with a platform; a memory-module controller communicatively connected with the communication interface; a non-volatile-memory block having a memory-block power supply; and a power-management integrated circuit (PMIC) configured to power up the memory-block power supply as part of an automatic boot-up sequence, the PMIC including PMIC control logic executable to perform PMIC operations including: determining whether a first critical fault occurred during a preceding cycle of operation of the memory module; detecting a second critical fault on the memory module during a current cycle of operation, and responsively performing fault-response operations including: setting a non-volatile critical-fault flag in the PMIC; powering down the memory-block power supply; and asserting a critical-fault-signal pin to the platform if the first critical fault occurred.

Example 23 is the memory module of Example 22, where the PMIC being configured to power up the memory-block power supply as part of the automatic boot-up sequence includes the PMIC being configured to power up the memory-block power supply when an input voltage to the PMIC reaches a threshold input voltage.

Example 24 is the memory module of Example 22 or Example 23, where both the PMIC and the non-volatile memory block are communicatively behind the memory-module controller with respect to the communication interface such that neither the PMIC nor the non-volatile memory block is directly accessible by the platform.

Example 25 is the memory module of any of the Examples 22-24, where the PMIC is configured to maintain the non-volatile critical-fault flag in a non-volatile register of the PMIC.

Example 26 is the memory module of any of the Examples 22-25, where determining whether the first critical fault occurred includes: determining that the first critical fault did not occur based on the non-volatile critical-fault flag being clear; and determining that the first critical fault did occur based on the non-volatile critical-fault flag being set.

Example 27 is the memory module of any of the Examples 22-26, where: the non-volatile critical-fault flag is one of multiple non-volatile critical-fault flags; and determining whether the first critical fault occurred includes: determining that the first critical fault did not occur based on each of the multiple non-volatile critical-fault flags being clear; and determining that the first critical fault did occur based on at least one of the multiple non-volatile critical-fault flags being set.

Example 28 is the memory module of any of the Examples 22-27, where the fault-response operations further include not asserting the critical-fault-signal pin if the first critical fault did not occur.

Example 29 is the memory module of any of the Examples 22-28, where not asserting the critical-fault-signal pin includes maintaining the critical-fault-signal pin in a high-impedance state.

Example 30 is the memory module of any of the Examples 22-29, the PMIC operations further including placing the PMIC in a non-isolated OFF state in response to determining that the first critical fault did not occur, the placing of the PMIC in the non-isolated OFF state including: the setting of the non-volatile critical-fault flag in the PMIC; the powering down of the memory-block power supply; and the asserting of the critical-fault-signal pin to the platform.

Example 31 is the memory module of any of the Examples 22-30, the PMIC operations further including placing the PMIC in a self-isolated OFF state in response to determining that the first critical fault did occur, the placing of the PMIC in the self-isolated OFF state including: the setting of the non-volatile critical-fault flag in the PMIC; the powering down of the memory-block power supply; and not asserting the critical-fault-signal pin.

Example 32 is the memory module of any of the Examples 22-31, the PMIC operations further including, prior to detecting the second critical fault, placing the PMIC in a no-previous-fault ON state in response to determining that the first critical fault did not occur, the placing of the PMIC in the no-previous-fault ON state including maintaining the critical-fault-signal pin in a high-impedance state.

Example 33 is the memory module of any of the Examples 22-32, the PMIC operations further including one or more pre-fault-detection operations, each of which is performed prior to the detecting of the second critical fault, the one or more pre-fault-detection operations including: placing the PMIC in a post-fault ON state in response to determining that the first critical fault did occur, the placing of the PMIC in the post-fault ON state including: maintaining the critical-fault-signal pin in a high-impedance state; and clearing the non-volatile critical-fault flag in the PMIC.

Example 34 is the memory module of Example 33, where: the one or more pre-fault-detection operations further include: copying a content of a non-volatile PMIC system block to a temporary storage location, the content of the non-volatile PMIC system block including the non-volatile critical-fault flag; and the clearing of the non-volatile critical-fault flag in the PMIC; and the clearing of the non-volatile critical-fault flag in the PMIC includes: generating modified content in the temporary storage location at least in part by clearing a copy of the non-volatile critical-fault flag in the temporary storage location; and writing the modified content back to the non-volatile PMIC system block.

Example 35 is the memory module of Example 34, where the one or more pre-fault-detection operations are performed with respect to multiple non-volatile critical-fault flags.

Example 36 is the memory module of any of the Examples 22-35, where one or both of the first critical fault and the second critical fault is selected from a group of critical faults, the group of critical faults consisting of an overvoltage-protection fault on an output rail of the non-volatile-memory block, an undervoltage-protection fault on the output rail of the non-volatile-memory block, an overcurrent-protection fault on the output rail of the non-volatile-memory block, and a critical-temperature fault on the memory module.

Example 37 is the memory module of any of the Examples 22-36, where: the PMIC operations further include logging values of the non-volatile critical-fault flag in association with values indicative of types of critical faults and non-critical fault that occur on the memory module; the logged value of the non-volatile critical-fault flag is set in association with values indicative of types of critical faults that occur; and the logged value of the non-volatile critical-fault flag is clear in association with values indicative of types of non-critical faults that occur.

Example 38 is at least one non-transitory computer-readable storage medium containing instructions that, when executed by at least one hardware processor, cause the hardware processor to perform operations including: determining whether a first critical fault occurred during a preceding cycle of operation of a memory module, the memory module including a communication interface configured to communicate with a platform, a memory-module controller communicatively connected with the communication interface, a non-volatile-memory block having a memory-block power supply, and a power-management integrated circuit (PMIC) configured to power up the memory-block power supply as part of an automatic boot-up sequence; and detecting a second critical fault on the memory module during a current cycle of operation, and responsively performing fault-response operations including: setting a non-volatile critical-fault flag in the PMIC; powering down the memory-block power supply; and asserting a critical-fault-signal pin to the platform if the first critical fault occurred.

Example 39 is the at least one non-transitory computer-readable storage medium of Example 38, where the PMIC being configured to power up the memory-block power supply as part of the automatic boot-up sequence includes the PMIC being configured to power up the memory-block power supply when an input voltage to the PMIC reaches a threshold input voltage.

Example 40 is the at least one non-transitory computer-readable storage medium of Example 38 or Example 39, where both the PMIC and the non-volatile memory block are communicatively behind the memory-module controller with respect to the communication interface such that neither the PMIC nor the non-volatile memory block is directly accessible by the platform.

Example 41 is the at least one non-transitory computer-readable storage medium of any of the Examples 38-40, where the PMIC is configured to maintain the non-volatile critical-fault flag in a non-volatile register of the PMIC.

Example 42 is the at least one non-transitory computer-readable storage medium of any of the Examples 38-41, where determining whether the first critical fault occurred includes: determining that the first critical fault did not occur based on the non-volatile critical-fault flag being clear; and determining that the first critical fault did occur based on the non-volatile critical-fault flag being set.

Example 43 is the at least one non-transitory computer-readable storage medium of any of the Examples 38-42, where: the non-volatile critical-fault flag is one of multiple non-volatile critical-fault flags; and determining whether the first critical fault occurred includes: determining that the first critical fault did not occur based on each of the multiple non-volatile critical-fault flags being clear; and determining that the first critical fault did occur based on at least one of the multiple non-volatile critical-fault flags being set.

Example 44 is the at least one non-transitory computer-readable storage medium of any of the Examples 38-43, where the fault-response operations further include not asserting the critical-fault-signal pin if the first critical fault did not occur.

Example 45 is the at least one non-transitory computer-readable storage medium of any of the Examples 38-44, where not asserting the critical-fault-signal pin includes maintaining the critical-fault-signal pin in a high-impedance state.

Example 46 is the at least one non-transitory computer-readable storage medium of any of the Examples 38-45, the operations further including placing the PMIC in a non-isolated OFF state in response to determining that the first critical fault did not occur, the placing of the PMIC in the non-isolated OFF state including: the setting of the non-volatile critical-fault flag in the PMIC; the powering down of the memory-block power supply; and the asserting of the critical-fault-signal pin to the platform.

Example 47 is the at least one non-transitory computer-readable storage medium of any of the Examples 38-46, the operations further including placing the PMIC in a self-isolated OFF state in response to determining that the first critical fault did occur, the placing of the PMIC in the self-isolated OFF state including: the setting of the non-volatile critical-fault flag in the PMIC; the powering down of the memory-block power supply; and not asserting the critical-fault-signal pin.

Example 48 is the at least one non-transitory computer-readable storage medium of any of the Examples 38-47, the operations further including, prior to detecting the second critical fault, placing the PMIC in a no-previous-fault ON state in response to determining that the first critical fault did not occur, the placing of the PMIC in the no-previous-fault ON state including maintaining the critical-fault-signal pin in a high-impedance state.

Example 49 is the at least one non-transitory computer-readable storage medium of any of the Examples 38-48, the operations further including one or more pre-fault-detection operations, each of which is performed prior to the detecting of the second critical fault, the one or more pre-fault-detection operations including: placing the PMIC in a post-fault ON state in response to determining that the first critical fault did occur, the placing of the PMIC in the post-fault ON state including: maintaining the critical-fault-signal pin in a high-impedance state; and clearing the non-volatile critical-fault flag in the PMIC.

Example 50 is the at least one non-transitory computer-readable storage medium of Example 49, where: the one or more pre-fault-detection operations further include: copying a content of a non-volatile PMIC system block to a temporary storage location, the content of the non-volatile PMIC system block including the non-volatile critical-fault flag; and the clearing of the non-volatile critical-fault flag in the PMIC; and the clearing of the non-volatile critical-fault flag in the PMIC includes: generating modified content in the temporary storage location at least in part by clearing a copy of the non-volatile critical-fault flag in the temporary storage location; and writing the modified content back to the non-volatile PMIC system block.

Example 51 is the at least one non-transitory computer-readable storage medium of Example 50, where the one or more pre-fault-detection operations are performed with respect to multiple non-volatile critical-fault flags.

Example 52 is the at least one non-transitory computer-readable storage medium of any of the Examples 38-51, where one or both of the first critical fault and the second critical fault is selected from a group of critical faults, the group of critical faults consisting of an overvoltage-protection fault on an output rail of the non-volatile-memory block, an undervoltage-protection fault on the output rail of the non-volatile-memory block, an overcurrent-protection fault on the output rail of the non-volatile-memory block, and a critical-temperature fault on the memory module.

Example 53 is the at least one non-transitory computer-readable storage medium of any of the Examples 38-52, where: the operations further include logging values of the non-volatile critical-fault flag in association with values indicative of types of critical faults and non-critical fault that occur on the memory module; the logged value of the non-volatile critical-fault flag is set in association with values indicative of types of critical faults that occur; and the logged value of the non-volatile critical-fault flag is clear in association with values indicative of types of non-critical faults that occur.

Example 54 is a method including: determining whether a first critical fault occurred during a preceding cycle of operation of a memory module, the memory module including a communication interface configured to communicate with a platform, a memory-module controller communicatively connected with the communication interface, a non-volatile-memory block having a memory-block power supply, and a power-management integrated circuit (PMIC) configured to power up the memory-block power supply as part of an automatic boot-up sequence; and detecting a second critical fault on the memory module during a current cycle of operation, and responsively performing fault-response operations including: setting a non-volatile critical-fault flag in the PMIC; powering down the memory-block power supply; and asserting a critical-fault-signal pin to the platform if the first critical fault occurred.

Example 55 is the method of Example 54, where the PMIC being configured to power up the memory-block power supply as part of the automatic boot-up sequence includes the PMIC being configured to power up the memory-block power supply when an input voltage to the PMIC reaches a threshold input voltage.

Example 56 is the method of Example 54 or Example 55, where both the PMIC and the non-volatile memory block are communicatively behind the memory-module controller with respect to the communication interface such that neither the PMIC nor the non-volatile memory block is directly accessible by the platform.

Example 57 is the method of any of the Examples 54-56, where the PMIC is configured to maintain the non-volatile critical-fault flag in a non-volatile register of the PMIC.

Example 58 is the method of any of the Examples 54-57, where determining whether the first critical fault occurred includes: determining that the first critical fault did not occur based on the non-volatile critical-fault flag being clear; and determining that the first critical fault did occur based on the non-volatile critical-fault flag being set.

Example 59 is the method of any of the Examples 54-58, where: the non-volatile critical-fault flag is one of multiple non-volatile critical-fault flags; and determining whether the first critical fault occurred includes: determining that the first critical fault did not occur based on each of the multiple non-volatile critical-fault flags being clear; and determining that the first critical fault did occur based on at least one of the multiple non-volatile critical-fault flags being set.

Example 60 is the method of any of the Examples 54-59, where the fault-response operations further include not asserting the critical-fault-signal pin if the first critical fault did not occur.

Example 61 is the method of any of the Examples 54-60, where not asserting the critical-fault-signal pin includes maintaining the critical-fault-signal pin in a high-impedance state.

Example 62 is the method of any of the Examples 54-61, further including placing the PMIC in a non-isolated OFF state in response to determining that the first critical fault did not occur, the placing of the PMIC in the non-isolated OFF state including: the setting of the non-volatile critical-fault flag in the PMIC; the powering down of the memory-block power supply; and the asserting of the critical-fault-signal pin to the platform.

Example 63 is the method of any of the Examples 54-62, further including placing the PMIC in a self-isolated OFF state in response to determining that the first critical fault did occur, the placing of the PMIC in the self-isolated OFF state including: the setting of the non-volatile critical-fault flag in the PMIC; the powering down of the memory-block power supply; and not asserting the critical-fault-signal pin.

Example 64 is the method of any of the Examples 54-63, further including, prior to detecting the second critical fault, placing the PMIC in a no-previous-fault ON state in response to determining that the first critical fault did not occur, the placing of the PMIC in the no-previous-fault ON state including maintaining the critical-fault-signal pin in a high-impedance state.

Example 65 is the method of any of the Examples 54-64, further including one or more pre-fault-detection operations, each of which is performed prior to the detecting of the second critical fault, the one or more pre-fault-detection operations including: placing the PMIC in a post-fault ON state in response to determining that the first critical fault did occur, the placing of the PMIC in the post-fault ON state including: maintaining the critical-fault-signal pin in a high-impedance state; and clearing the non-volatile critical-fault flag in the PMIC.

Example 66 is the method of Example 65, where: the one or more pre-fault-detection operations further include: copying a content of a non-volatile PMIC system block to a temporary storage location, the content of the non-volatile PMIC system block including the non-volatile critical-fault flag; and the clearing of the non-volatile critical-fault flag in the PMIC; and the clearing of the non-volatile critical-fault flag in the PMIC includes: generating modified content in the temporary storage location at least in part by clearing a copy of the non-volatile critical-fault flag in the temporary storage location; and writing the modified content back to the non-volatile PMIC system block.

Example 67 is the method of Example 66, where the one or more pre-fault-detection operations are performed with respect to multiple non-volatile critical-fault flags.

Example 68 is the method of any of the Examples 54-67, where one or both of the first critical fault and the second critical fault is selected from a group of critical faults, the group of critical faults consisting of an overvoltage-protection fault on an output rail of the non-volatile-memory block, an undervoltage-protection fault on the output rail of the non-volatile-memory block, an overcurrent-protection fault on the output rail of the non-volatile-memory block, and a critical-temperature fault on the memory module.

Example 69 is the method of any of the Examples 54-68, where: the method further includes logging values of the non-volatile critical-fault flag in association with values indicative of types of critical faults and non-critical fault that occur on the memory module; the logged value of the non-volatile critical-fault flag is set in association with values indicative of types of critical faults that occur; and the logged value of the non-volatile critical-fault flag is clear in association with values indicative of types of non-critical faults that occur.

To promote an understanding of the principles of the present disclosure, various embodiments are illustrated in the drawings. The embodiments disclosed herein are not intended to be exhaustive or to limit the present disclosure to the precise forms that are disclosed in the above detailed description. Rather, the described embodiments have been selected so that others skilled in the art may utilize their teachings. Accordingly, no limitation of the scope of the present disclosure is thereby intended.

As used in this disclosure, including in the claims, phrases of the form "at least one of A and B," "at least one of A, B, and C," and the like should be interpreted as if the language "A and/or B," "A, B, and/or C," and the like had been used in place of the entire phrase. Unless explicitly stated otherwise in connection with a particular instance, this manner of phrasing is not limited in this disclosure to meaning only "at least one of A and at least one of B," "at least one of A, at least one of B, and at least one of C," and so on. Rather, as used herein, the two-element version covers each of the following: one or more of A and no B, one or more of B and no A, and one or more of A and one or more of B. And similarly for the three-element version and beyond. Similar construction should be given to such phrases in which "one or both," "one or more," and the like is used in place of "at least one," again unless explicitly stated otherwise in connection with a particular instance.

In any instances in this disclosure, including in the claims, in which numeric modifiers such as first, second, and third are used in reference to components, data (e.g., values, identifiers, parameters, and/or the like), and/or any other elements, such use of such modifiers is not intended to denote or dictate any specific or required order of the elements that are referenced in this manner. Rather, any such use of such modifiers is intended to assist the reader in distinguishing elements from one another, and should not be interpreted as insisting upon any particular order or carrying any other significance, unless such an order or other significance is clearly and affirmatively explained herein.

Furthermore, in this disclosure, in one or more embodiments, examples, and/or the like, it may be the case that one or more components of one or more devices, systems, and/or the like are referred to as modules that carry out (e.g., perform, execute, and the like) various functions. With respect to any such usages in the present disclosure, a module includes both hardware and instructions. The hardware could include one or more processors, one or more microprocessors, one or more microcontrollers, one or more microchips, one or more application-specific integrated circuits (ASICs), one or more field programmable gate arrays (FPGAs), one or more graphical processing units (GPUs), one or more tensor processing units (TPUs), and/or one or more devices and/or components of any other type deemed suitable by those of skill in the art for a given implementation.

In at least one embodiment, the instructions for a given module are executable by the hardware for carrying out the one or more herein-described functions of the module, and could include hardware (e.g., hardwired) instructions, firmware instructions, software instructions, and/or the like, stored in any one or more non-transitory computer-readable storage media deemed suitable by those of skill in the art for a given implementation. Each such non-transitory computer-readable storage medium could be or include memory (e.g., random access memory (RAM), read-only memory (ROM), erasable programmable read-only memory (EPROM), electrically erasable programmable read-only memory (EEPROM a.k.a. E2PROM), flash memory, and/or one or more other types of memory) and/or one or more other types of non-transitory computer-readable storage medium. A module could be realized as a single component or be distributed across multiple components. In some cases, a module may be referred to as a unit.

Moreover, consistent with the fact that the entities and arrangements that are described herein, including the entities and arrangements that are depicted in and described in connection with the drawings, are presented as examples and not by way of limitation, any and all statements or other indications as to what a particular drawing "depicts," what a particular element or entity in a particular drawing or otherwise mentioned in this disclosure "is" or "has," and any and all similar statements that are not explicitly self-qualifying by way of a clause such as "In at least one embodiment," and that could therefore be read in isolation and out of context as absolute and thus as a limitation on all embodiments, can only properly be read as being constructively qualified by such a clause. It is for reasons akin to brevity and clarity of presentation that this implied qualifying clause is not repeated ad nauseum in this disclosure.

What is claimed is:

1. A power-management integrated circuit (PMIC) comprising:
   a PMIC interface configured to be operably engaged with a memory module that is operably engaged with a platform, the memory module comprising a non-volatile memory block having a memory-block power supply controlled by the PMIC;
   a critical-fault signal pin, an assertion of which causes the platform to shut down; and
   PMIC control logic executable to perform PMIC operations comprising:
      determining whether an indicator set of one or more non-volatile critical-fault indicators indicates that at least one prior-cycle critical fault occurred during a prior cycle of operation;

determining whether a current-cycle critical fault occurs during an automatic bootup sequence of the memory-block power supply during a current cycle of operation; and based on determining that (i) the indicator set indicates that at least one prior-cycle critical fault occurred and (ii) a current-cycle critical fault does occur during the automatic bootup sequence: setting, in the indicator set, a critical-fault indicator corresponding to the occurrence of the current-cycle critical fault; powering down the memory-block power supply; and not asserting the critical-fault signal pin to the platform.

2. The PMIC of claim 1, the PMIC operations further comprising clearing each non-volatile critical-fault indicator in the indicator set based on determining that (i) the indicator set indicates that at least one prior-cycle critical fault occurred and (ii) a current-cycle critical fault does not occur during the automatic bootup sequence, the memory module being available to the platform for input/output operations after completion of the automatic bootup sequence.

3. The PMIC of claim 2, the PMIC operations further comprising, after clearing each non-volatile critical-fault indicator in the indicator set, detecting a post-bootup current-cycle critical fault, and responsively:

setting, in the indicator set, a critical-fault indicator corresponding to the post-bootup current-cycle critical fault;
powering down the memory-block power supply; and
asserting the critical-fault signal pin to the platform.

4. The PMIC of claim 1, the PMIC operations further comprising operating in a normal mode based on determining that (i) the indicator set indicates that no prior-cycle critical faults occurred and (ii) a current-cycle critical fault does not occur during the automatic bootup sequence, the memory module being available to the platform for input/output operations during the normal mode.

5. The PMIC of claim 4, the PMIC operations further comprising detecting, during operation in the normal mode, a post-bootup current-cycle critical fault, and responsively:

setting, in the indicator set, a critical-fault indicator corresponding to the post-bootup current-cycle critical fault;
powering down the memory-block power supply; and
asserting the critical-fault signal pin to the platform.

6. The PMIC of claim 5, the PMIC operations further comprising, based on determining that (i) the indicator set indicates that no prior-cycle critical faults occurred and (ii) a current-cycle critical fault does occur during the automatic bootup sequence:

setting, in the indicator set, a critical-fault indicator corresponding to the post-bootup current-cycle critical fault;
powering down the memory-block power supply; and
asserting the critical-fault signal pin to the platform.

7. The PMIC of claim 1, wherein:
the memory module further comprises a memory-module controller operably engaged with the platform via a memory-module interface;
the memory-module controller is also operably engaged with the PMIC; and
both the PMIC and the non-volatile memory block are positioned behind the memory-module controller with respect to the memory-module interface such that neither the PMIC nor the non-volatile memory block is directly accessible to the platform.

8. A memory module comprising:
a memory-module interface configured to be operably engaged with a platform;
a power-management integrated circuit (PMIC);
a non-volatile memory block having a memory-block power supply controlled by the PMIC, the PMIC comprising a critical-fault signal pin, an assertion of which causes the platform to shut down, the PMIC further comprising PMIC control logic executable to perform PMIC operations comprising:

determining whether an indicator set of one or more non-volatile critical-fault indicators indicates that at least one prior-cycle critical fault occurred during a prior cycle of operation;

determining whether a current-cycle critical fault occurs during an automatic bootup sequence of the memory-block power supply during a current cycle of operation; and based on determining that (i) the indicator set indicates that at least one prior-cycle critical fault occurred and (ii) a current-cycle critical fault does occur during the automatic bootup sequence: setting, in the indicator set, a critical-fault indicator corresponding to the occurrence of the current-cycle critical fault; powering down the memory-block power supply; and not asserting the critical-fault signal pin to the platform.

9. The memory module of claim 8, the PMIC operations further comprising clearing each non-volatile critical-fault indicator in the indicator set based on determining that (i) the indicator set indicates that at least one prior-cycle critical fault occurred and (ii) a current-cycle critical fault does not occur during the automatic bootup sequence, the memory module being available to the platform for input/output operations after completion of the automatic bootup sequence.

10. The memory module of claim 9, the PMIC operations further comprising, after clearing each non-volatile critical-fault indicator in the indicator set, detecting a post-bootup current-cycle critical fault, and responsively:

setting, in the indicator set, a critical-fault indicator corresponding to the post-bootup current-cycle critical fault;
powering down the memory-block power supply; and
asserting the critical-fault signal pin to the platform.

11. The memory module of claim 8, the PMIC operations further comprising operating in a normal mode based on determining that (i) the indicator set indicates that no prior-cycle critical faults occurred and (ii) a current-cycle critical fault does not occur during the automatic bootup sequence, the memory module being available to the platform for input/output operations during the normal mode.

12. The memory module of claim 11, the PMIC operations further comprising detecting, during operation in the normal mode, a post-bootup current-cycle critical fault, and responsively:

setting, in the indicator set, a critical-fault indicator corresponding to the post-bootup current-cycle critical fault;
powering down the memory-block power supply; and
asserting the critical-fault signal pin to the platform.

13. The memory module of claim 12, the PMIC operations further comprising, based on determining that (i) the indicator set indicates that no prior-cycle critical faults occurred and (ii) a current-cycle critical fault does occur during the automatic bootup sequence:

setting, in the indicator set, a critical-fault indicator corresponding to the post-bootup current-cycle critical fault;

powering down the memory-block power supply; and asserting the critical-fault signal pin to the platform.

14. The memory module of claim 8, further comprising a memory-module controller operably engaged with the memory-module interface and the PMIC, both the PMIC and the non-volatile memory block being positioned behind the memory-module controller with respect to the memory-module interface such that neither the PMIC nor the non-volatile memory block is directly accessible to the platform.

15. A system comprising:

a platform; and a memory module comprising a power-management integrated circuit (PMIC), a non-volatile memory block having a memory-block power supply controlled by the PMIC, and a memory-module interface configured to be operably engaged with the platform, the PMIC comprising a critical-fault signal pin, an assertion of which causes the platform to shut down, and PMIC control logic executable to perform PMIC operations comprising:

determining whether an indicator set of one or more non-volatile critical-fault indicators indicates that at least one prior-cycle critical fault occurred during a prior cycle of operation;

determining whether a current-cycle critical fault occurs during an automatic bootup sequence of the memory-block power supply during a current cycle of operation; and based on determining that (i) the indicator set indicates that at least one prior-cycle critical fault occurred and (ii) a current-cycle critical fault does occur during the automatic bootup sequence: setting, in the indicator set, a critical-fault indicator corresponding to the occurrence of the current-cycle critical fault; powering down the memory-block power supply; and not asserting the critical-fault signal pin to the platform.

16. The system of claim 15, the PMIC operations further comprising clearing each non-volatile critical-fault indicator in the indicator set based on determining that (i) the indicator set indicates that at least one prior-cycle critical fault occurred and (ii) a current-cycle critical fault does not occur during the automatic bootup sequence, the memory module being available to the platform for input/output operations after completion of the automatic bootup sequence.

17. The system of claim 16, the PMIC operations further comprising, after clearing each non-volatile critical-fault indicator in the indicator set, detecting a post-bootup current-cycle critical fault, and responsively:

setting, in the indicator set, a critical-fault indicator corresponding to the post-bootup current-cycle critical fault;

powering down the memory-block power supply; and asserting the critical-fault signal pin to the platform.

18. The system of claim 15, the PMIC operations further comprising operating in a normal mode based on determining that (i) the indicator set indicates that no prior-cycle critical faults occurred and (ii) a current-cycle critical fault does not occur during the automatic bootup sequence, the memory module being available to the platform for input/output operations during the normal mode.

19. The system of claim 18, the PMIC operations further comprising detecting, during operation in the normal mode, a post-bootup current-cycle critical fault, and responsively:

setting, in the indicator set, a critical-fault indicator corresponding to the post-bootup current-cycle critical fault;

powering down the memory-block power supply; and asserting the critical-fault signal pin to the platform.

20. The system of claim 19, the PMIC operations further comprising, based on determining that (i) the indicator set indicates that no prior-cycle critical faults occurred and (ii) a current-cycle critical fault does occur during the automatic bootup sequence:

setting, in the indicator set, a critical-fault indicator corresponding to the post-bootup current-cycle critical fault;

powering down the memory-block power supply; and asserting the critical-fault signal pin to the platform.

21. The system of claim 15, the memory module further comprising a memory-module controller operably engaged with the memory-module interface and the PMIC, both the PMIC and the non-volatile memory block being positioned behind the memory-module controller with respect to the memory-module interface such that neither the PMIC nor the non-volatile memory block is directly accessible to the platform.

* * * * *